(12) United States Patent
Yamamoto et al.

(10) Patent No.: US 12,251,951 B2
(45) Date of Patent: Mar. 18, 2025

(54) PLATE MAKING SYSTEM AND PLATE MAKING METHOD

(71) Applicants: ASAHI KASEI KABUSHIKI KAISHA, Tokyo (JP); ESKO Graphics imaging Gesellschaft mit beschrankter Haftung, Itzehoe (DE)

(72) Inventors: Yuki Yamamoto, Tokyo (JP); Hideo Saito, Tokyo (JP); Thomas Pascal, Itzehoe (DE); Klein Thomas, Itzehoe (DE)

(73) Assignees: ASAHI KASEI KABUSHIKI KAISHA, Tokyo (JP); ESKO GRAPHICS IMAGING GESELLSCHAFT MIT BESCHRANKTER HAFTUNG, Itzehoe (DE)

( * ) Notice: Subject to any disclaimer, the term of this patent is extended or adjusted under 35 U.S.C. 154(b) by 53 days.

(21) Appl. No.: 17/915,743

(22) PCT Filed: Mar. 31, 2021

(86) PCT No.: PCT/JP2021/014010
§ 371 (c)(1),
(2) Date: Sep. 29, 2022

(87) PCT Pub. No.: WO2021/201162
PCT Pub. Date: Oct. 7, 2021

(65) Prior Publication Data
US 2023/0126302 A1    Apr. 27, 2023

(30) Foreign Application Priority Data

Apr. 2, 2020  (JP) ................................ 2020-066682
Sep. 25, 2020 (JP) ................................ 2020-161162

(51) Int. Cl.
*B41F 5/24*     (2006.01)
*B41M 1/04*    (2006.01)
(Continued)

(52) U.S. Cl.
CPC ................. *B41M 1/04* (2013.01); *B41F 5/24* (2013.01); *B41C 1/05* (2013.01); *B41N 1/12* (2013.01)

(58) Field of Classification Search
None
See application file for complete search history.

(56) References Cited

U.S. PATENT DOCUMENTS 4,727,806 A    3/1988  Green, Sr.
6,016,188 A *  1/2000  Okamura .............. B41C 1/1075
                                                        101/463.1
(Continued)

FOREIGN PATENT DOCUMENTS

CN    205631653        10/2016
EP    0762723 A2 *    3/1997
(Continued)

OTHER PUBLICATIONS

English translation of JP 2004-114598 A to Nishiyama, publication date Apr. 15, 2004. (Year: 2004).*

(Continued)

*Primary Examiner* — Leslie J Evanisko
(74) *Attorney, Agent, or Firm* — GREENBLUM & BERNSTEIN, P.L.C.

(57) ABSTRACT

A plate making system comprises a writing device, an exposure device, a developing device, a plate cutting device, a first transfer device, a second transfer device and a third transfer device in an integrated manner. The plate making system also comprises a control device that controls a series of plate making processes for a flexographic printing origi- (Continued)

nal plate performed by the writing device, the exposure device, the developing device and the plate cutting device.

34 Claims, 18 Drawing Sheets

(51) Int. Cl.
  *B41C 1/05* (2006.01)
  *B41N 1/12* (2006.01)

(56) References Cited

U.S. PATENT DOCUMENTS

| | | | |
|---|---|---|---|
| 2003/0075257 | A1 | 4/2003 | Salvestro |
| 2006/0124008 | A1 | 6/2006 | Kessenich et al. |
| 2011/0079161 | A1 | 4/2011 | Amsili et al. |
| 2013/0295382 | A1 | 11/2013 | Yuki et al. |
| 2018/0217502 | A1 | 8/2018 | Dietz et al. |
| 2019/0351688 | A1* | 11/2019 | Sievers ............... G06K 7/1413 |
| 2020/0016916 | A1 | 1/2020 | Sievers et al. |

FOREIGN PATENT DOCUMENTS

| | | |
|---|---|---|
| EP | 2 397 327 | 12/2011 |
| JP | 3-97225 | 4/1991 |
| JP | 11-105445 | 4/1999 |
| JP | 2001-142198 | 5/2001 |
| JP | 2001-201848 | 7/2001 |
| JP | 2001-246722 | 9/2001 |
| JP | 2002-127369 | 5/2002 |
| JP | 2003-344990 | 12/2003 |
| JP | 2004114598 A * | 4/2004 |
| JP | 2004-351748 | 12/2004 |
| JP | 2006-69120 | 3/2006 |
| JP | 2007-21898 | 2/2007 |
| JP | 4374684 | 12/2009 |
| JP | 2010-54957 | 3/2010 |
| JP | 2012-116165 | 6/2012 |
| JP | 2012-148415 | 8/2012 |
| JP | 2013-507269 | 3/2013 |
| JP | 2015-139904 | 8/2015 |
| JP | 2017-528763 | 9/2017 |
| JP | 2018-54981 | 4/2018 |
| JP | 2020-46544 | 3/2020 |
| WO | 2019/192764 | 10/2019 |

OTHER PUBLICATIONS

Supplemental European Search Report received in EP Application No. 21780964.9, dated Jul. 31, 2023.

International Search Report issued in International Patent Application No. PCT/JP2021/014010, dated Jun. 15, 2021, along with an English translation thereof.

International Preliminary Report on Patentability issued in International Patent Application No. PCT/JP2021/014010, dated Jun. 15, 2021, along with an English translation thereof.

* cited by examiner

Fig. 5

| IDENTIFICATION NUMBER | PLATE CUTTING INFORMATION |
|---|---|
| 1 | A |
| 2 | B |
| 3 | C |
| 4 | D |
| 5 | E |
|  |  |

PLATE MAKING SYSTEM AND PLATE MAKING METHOD

TECHNICAL FIELD

The present invention relates to a plate making system and a plate making method.

BACKGROUND ART

In making a flexographic printing original plate, a laser writing step of applying laser writing onto a flexographic printing original plate, an exposure step of exposing the flexographic printing original plate subjected to the laser writing, a developing step of selectively removing an unexposed portion of the flexographic printing original plate, a plate cutting step of cutting the flexographic printing original plate into a desired size and shape, etc., have to be performed in the order mentioned. These various steps are performed by the respective devices.

CITATION LIST

Patent Document

Patent Document 1: JP 4374684 B

SUMMARY

Technical Problem

However, when the various steps of making the flexographic printing original plate are performed by a plurality of devices as described above, an operator has to transfer the flexographic printing original plate between the devices. Thus, it takes time to transfer the flexographic printing original plate between the devices and to attach or detach the flexographic printing original plate to or from each device, and this therefore requires a long time to make the flexographic printing original plate. In addition, for example, depending on the operator involved, more time may be required to transfer the flexographic printing original plate from an exposure device to a developing device, causing longer post-exposure time, or the time to start up each device may vary, which would cause the exposure intensity to vary and therefore cause the exposure dose to vary, thereby resulting in unstable quality of the flexographic printing original plate.

The present invention has been made in light of such circumstances and an object of the invention is to provide a print making system and a print making method capable of shortening the time required for making flexographic printing original plates and stabilizing the quality of the resulting flexographic printing original plates.

Solution to Problem

As a result of intensive study, the inventors have found that the above problem can be solved by automatizing a series of plate making processes, and have thereby achieved the present invention.

More specifically, the present invention comprises the aspects set forth below.

(1) A plate making system, comprising: a writing device that applies laser writing onto a flexographic printing original plate; an exposure device that exposes the flexographic printing original plate subjected to the laser writing; a developing device that develops the exposed flexographic printing original plate; a plate cutting device that cuts the developed flexographic printing original plate; a first transfer device that transfers the flexographic printing original plate subjected to the laser writing by the writing device to the exposure apparatus; a second transfer device that transfers the flexographic printing original plate exposed by the exposure device to the developing device; and a third transfer device that transfers the flexographic printing original plate developed by the developing device to the plate cutting device, wherein the plate making system comprises the writing device, the exposure device, the developing device, the plate cutting device, the first transfer device, the second transfer device and the third transfer device in an integrated manner, and wherein the plate making system further comprises a control device that controls a series of plate making processes for the flexographic printing original plate performed by the writing device, the exposure device, the developing device and the plate cutting device.

(2) The plate making system according to (1), wherein the control device includes: device control units provided for the writing device, the exposure device, the developing device and the plate cutting device, respectively, and configured to control the respective devices; and a system control unit configured to control the plurality of devices so as to control the entire plate making system.

(3) The plate making system according to (1) or (2), wherein the writing device, the exposure device, the developing device and the plate cutting device are arranged in a linear manner or arranged so as to form an angle between devices.

(4) The plate making system according to any one of (1) to (3), wherein the control device is configured to manage the series of plate making processes so that a desired plate cutting by the plate cutting device is performed for the flexographic printing original plate subjected to the laser writing by the writing device.

(5) The plate making system according to (4), wherein the control device includes: an information associating unit that associates an identification of a flexographic printing original plate to be subjected to the laser writing by the writing device with plate cutting information, related to this flexographic printing original plate, for causing a desired plate cutting to be performed by the plate cutting device; and an information obtaining unit that obtains the identification of the flexographic printing original plate to be subjected to plate cutting by the plate cutting device and obtains, based on the obtained identification, the plate cutting information that has been associated with the obtained identification by the information associating unit, wherein the plate cutting device is configured to cut the flexographic printing original plate based on the plate cutting information obtained by the information obtaining unit.

(6) The plate making system according to (5), wherein the information obtaining unit obtains the identification which has been sequentially transmitted from the writing device to the exposure device, to the developing device and to the plate cutting device.

(7) The plate making system according to (5) or (6), wherein the identification of the flexographic printing original plate is delivered directly between the writing device and the exposure device, between the exposure device and the developing device, and between the developing device and the plate cutting device, and/or delivered using a combined route through the entire plate making system comprising the plurality of devices.

(8) The plate making system according to (5), wherein: the writing device writes the identification onto the flexographic printing original plate; and the information obtaining unit obtains the identification written on the flexographic printing original plate to be subjected to the plate cutting by the plate cutting device, and obtains, based on the obtained identification, the plate cutting information that has been associated with the obtained identification by the information associating unit.

(9) The plate making system according to (8), further comprising at least one type of reading device, selected from a camera and a barcode reader, which reads the identification written on the flexographic printing original plate, wherein the information obtaining unit obtains the identification by converting data which has been read using the reading device into binarized data.

(10) The plate making system according to (5), wherein: the identification is handling order information for plate making of flexographic printing original plates; and the information obtaining unit obtains handling order information of a flexographic printing original plate to be subjected to plate cutting by the plate cutting device and obtains, based on the handling order information of the flexographic printing original plate, the plate cutting information that has been associated with the obtained handling order information by the information associating unit.

(11) The plate making system according to (10), further comprising a job counter that counts flexographic printing original plates to be subjected to plate cutting by the plate cutting device, wherein the information obtaining unit obtains the handling order information of the flexographic printing original plates using the job counter.

(12) The plate making system according to any one of (1) to (11), wherein the developing device performs development, drying and post-exposure as an integrated unit, the developing device continuously transfers the flexographic printing original plate with a transfer device that has a plate setter for transferring the flexographic printing original plate; a device for attaching the plate setter to the flexographic printing original plate is provided at an entrance of the unit of the developing device; and a device for removing the plate setter from the flexographic printing original plate is provided at an exit of the unit of the developing device.

(13) The plate making system according to (12), wherein the control device calculates a desired developing amount for flexographic printing original plates to be developed by the developing device based on information of the flexographic printing original plates to be subjected to the laser writing by the writing device and adjusts a developing capacity of the developer based on the developing amount.

(14) The plate making system according to (12) or (13), wherein: the developing device has functions of performing development, drying and post-exposure; and the control device controls an exposure lamp so that a temperature of the flexographic printing original plate becomes constant during the post exposure.

(15) The plate making system according to any one of (12) to (14), wherein the development performed by the developing device is water development.

(16) The plate making system according to any one of (1) to (15), further comprising: an affixing device that affixes a flexographic printing plate subjected to plate cutting onto a sleeve or a printing cylinder; and a fourth transfer device that transfers the flexographic printing plate subjected to the plate cutting by the plate cutting device to the affixing device, wherein the plate making system comprises the writing device, the exposure device, the developing device, the plate cutting device, the first transfer device, the second transfer device, the third transfer device, the fourth transfer device and the affixing device in an integrated manner, and wherein the control device controls a series of plate making processes for the flexographic printing original plate and the flexographic printing plate performed by the writing device, the exposure device, the developing device, the plate cutting device and the affixing device.

(17) The plate making system according to (16), wherein the control device further includes: a device control unit provided for the affixing device so as to control the affixing device.

(18) The plate making system according to (16) or (17), wherein the writing device, the exposure device, the developing device, the plate cutting device and the affixing device are arranged in a linear manner or arranged so as to form an angle between devices.

(19) The plate making system according to any one of (16) to (18), wherein the control device is configured to manage the series of plate making processes so that affixing by the affixing device is performed at a desired position on the sleeve or on the print cylinder for the flexographic printing original plate subjected to the laser writing by the writing device.

(20) The plate making system according to (19), wherein the control device includes: a second information associating unit that associates an identification of a flexographic printing original plate to be subjected to the laser writing by the writing device with affixing information, related to this flexographic printing original plate, for causing a desired affixing to be performed by the affixing device; and a second information obtaining unit that obtains an identification of a flexographic printing plate to be subjected to affixing by the affixing device and obtains, based on the obtained identification, the affixing information that has been associated with the obtained identification by the second information associating unit, wherein the affixing device is configured to affix the flexographic printing plate based on the affixing information obtained by the second information obtaining unit.

(21) The plate making system according to 20, wherein the second information obtaining unit obtains the identification which has been sequentially transmitted from the writing device, to the exposure device, to the developing device, to the plate cutting device and to the affixing device.

(22) The plate making system according to (20), wherein: the writing device writes the identification onto the flexographic printing original plate; and the second information obtaining unit obtains the identification written on the flexographic printing original plate related to a flexographic printing plate to be subjected to affixing by the affixing device, and obtains, based on the obtained identification, the affixing information that has been associated with the obtained identification by the second information associating unit.

(23) The plate making system according to (22), wherein an identification of the flexographic printing plate to be subjected to affixing is laser-written on at least two portions in the flexographic printing original plate by the writing device.

(24) The plate making system according to (22) or (23), wherein: the affixing device or the fourth transfer device includes at least one type of second reading device, selected from a camera and a barcode reader, which reads the identification written on the flexographic printing original plate; and the second information obtaining unit obtains the identification by converting data which has been read using the second reading device into binarized data.

(25) The plate making system according to (24), wherein: the second reading device also obtains position information of the flexographic printing plate subjected to plate cutting; and the affixing device is configured to affix the flexographic printing plate based on the affixing information obtained by the second information obtaining unit and the position information obtained by the second reading device.

(26) The plate making system according to (20), wherein: the identification is handling order information for plate making of flexographic printing original plates; and the second information obtaining unit obtains handling order information of the flexographic printing plate to be subjected to affixing by the affixing device and obtains, based on the handling order information of the flexographic printing original plate, the affixing information that has been associated with the obtained handling order information by the second information associating unit.

(27) The plate making system according to any one of (16) to (26), wherein the fourth transfer device is a robotic arm having at least one type of suction pad selected from elastomer materials such as polybutadiene rubber, polyacrylonitrile butadiene rubber, polyurethane, silicone and fluorine-based rubber.

(28) The plate making system according to any one of (16) to (27), wherein the affixing device is configured to use the fourth transfer device to transfer the flexographic printing plate on the sleeve or the printing cylinder and directly affix the flexographic printing plate onto the sleeve or the printing cylinder while rotating the sleeve or the printing cylinder.

(29) The plate making system according to any one of (16) to (27), wherein the affixing device includes a mounter table having a conveyor, the affixing device being configured to convey, on the mounter table, the flexographic printing plate which has been transferred by the fourth transfer device onto the mounter table, and affix the flexographic printing plate onto the sleeve or the printing cylinder while rotating the sleeve or the printing cylinder having a cushioning tape affixed thereto.

(30) The plate making system according to any one of (16) to (29), wherein the affixing device includes a stocker that stores flexographic printing plates before being subjected to affixing.

(31) The plate making system according to any one of (1) to (30), further comprising: a stocker that stores flexographic printing original plates before being subjected to writing by the writing device; and a plate supply device that automatically supplies a flexographic printing original plate from the stocker to the writing device to remove a cover film from the flexographic printing original plate.

(32) The plate making system according to any one of (1) to (31), comprising a test device having a camera, the test device testing the flexographic printing original plate after development by the developing device and/or the flexographic printing plate after plate cutting by the plate cutting device.

(33) The plate making system according to (32), wherein the test device tests the flexographic printing original plate and/or the flexographic printing plate based on information written by the writing device.

(34) A plate making method, comprising: a writing step of applying laser writing onto a flexographic printing original plate; an exposure step of exposing the flexographic printing original plate subjected to the laser writing; a developing step of developing the exposed flexographic printing original plate; and a plate cutting step of cutting the developed flexographic printing original plate, wherein the steps are performed sequentially and automatically based on an identification of the flexographic printing original plate.

(35) The method according to (34), wherein a series of plate making processes is managed so that a desired plate cutting in the plate cutting step is performed for the flexographic printing original plate subjected to the laser writing in the writing step.

(36) The method according to (35), further comprising: an information associating step of associating an identification of a flexographic printing original plate to be subjected to the laser writing in the writing step with plate cutting information, related to this flexographic printing original plate, for causing a desired plate cutting to be performed in the plate cutting step; and an information obtaining step of obtaining the identification of the flexographic printing original plate to be subjected to the plate cutting step and obtaining, based on the obtained identification, the plate cutting information that has been associated with the obtained identification in the information associating step, wherein the flexographic printing original plate is cut in the plate cutting step based on the plate cutting information obtained in the information obtaining step.

(37) The method according to 36, wherein the information obtaining step obtains the identification which has been sequentially transmitted from a writing device performing the writing step, to an exposure device performing the exposure step, to a developing device performing the developing step and to a plate cutting device performing the plate cutting step.

(38) The method according to any one of (34) to (37), wherein the identification of the flexographic printing original plate is delivered directly between a writing device performing the writing step and an exposure device performing the exposure step, between the exposure device and a developing device performing the developing step, and between the developing device and a plate cutting device performing the plate cutting step, and/or delivered using a combined route through an entire plate making system comprising the plurality of devices and a control device that controls plate making processes.

(39) The method according to (36), wherein: the writing step writes the identification onto the flexographic printing original plate; and the information obtaining step obtains the identification written on the flexographic printing original plate to be subjected to the plate cutting step, and obtains, based on the obtained identification, the plate cutting information that has been associated with the obtained identification in the information associating step.

(40) The method according to (39), wherein the information obtaining step reads the identification written on the flexographic printing original plate using a reading device to obtain the identification.

(41) The method according to (36), wherein: the identification is handling order information for plate making of flexographic printing original plates; and the information obtaining step obtains handling order information of the flexographic printing original plate to be subjected to the plate cutting step and obtains, based on the handling order information of the flexographic printing original plate, the plate cutting information that has been associated with the obtained handling order information in the information associating step.

(42) The method according to (41), wherein the information obtaining step counts flexographic printing original plates to be subjected to the plate cutting step using a job counter and obtains the handling order information of the flexographic printing original plates.

(43) The method according to any one of (34) to (42), wherein the developing step includes a step of performing development using a developer, drying and post-exposure.

(44) The method according to (43), wherein a desired developing amount for flexographic printing original plates to be developed in the developing step is calculated based on information of the flexographic printing original plates to be subjected to the laser writing in the writing step, and a developing capacity of the developer is adjusted based on the developing amount.

(45) The method according to (43) or (44), wherein: the developing step includes a step of performing development, drying and post-exposure; and an exposure lamp is controlled so that a temperature of the flexographic printing original plate becomes constant during the post exposure.

(46) The method according to any one of (43) to (45), wherein the development performed in the developing step is water development.

(47) The method according to any one of (34) to (46), further comprising: an affixing step of affixing a flexographic printing plate subjected to plate cutting onto a sleeve or a printing cylinder, wherein the writing step, the exposure step, the developing step, the plate cutting step and the affixing step are performed sequentially and automatically.

(48) The method according to (47), wherein a series of plate making processes is managed so that affixing in the affixing step is performed at a desired position on the sleeve or the printing cylinder with respect to the flexographic printing original plate subjected to the laser writing in the writing step.

(49) The method according to (47) or (48), further comprising: a second information associating step of associating an identification of a flexographic printing original plate to be subjected to the laser writing in the writing step with affixing information, related to this flexographic printing original plate, for causing a desired affixing to be performed in the affixing step; and a second information obtaining step of obtaining the identification of the flexographic printing plate to be subjected to the affixing in the affixing step and obtaining, based on the obtained identification, the affixing information that has been associated with the obtained identification in the second information associating step, wherein the affixing of the flexographic printing plate is performed in the affixing step based on the affixing information obtained in the second information obtaining step.

(50) The method according to (49), wherein the second information obtaining step obtains the identification which has been sequentially transmitted from a writing device performing the writing step, to an exposure device performing the exposure step, to a developing device performing the developing step, to a plate cutting device performing the plate cutting step, and to an affixing device performing the affixing step.

(51) The method according to (49), wherein: the writing step writes the identification onto the flexographic printing original plate; and the second information obtaining step obtains the identification written on the flexographic printing original plate to be subjected to the affixing step, and obtains, based on the obtained identification, the affixing information that has been associated with the obtained identification in the second information associating step.

(52) The method according to (49), wherein: the identification is handling order information for plate making of flexographic printing original plates; and the second information obtaining step obtains handling order information of the flexographic printing plate to be subjected to the affixing step and obtains, based on the handling order information of the flexographic printing original plate, the affixing information that has been associated with the obtained handling order information in the second information associating step.

(53) The method according to any one of (49) to (52), further comprising a storage step of transferring the flexographic printing plate subjected to plate cutting in the plate cutting step to a stocker and storing the flexographic printing plate in the stocker.

(54) The method according to (53), further comprising a position information obtaining step of obtaining position information of the flexographic printing plate subjected to the plate cutting in the plate cutting step, wherein the affixing step and/or the storage step of the flexographic printing plate are performed based on the affixing information obtained in the second information obtaining step and the position information obtained in the position information obtaining step.

(55) The method according to any one of (47) to (54), wherein, in the affixing step, a plurality of flexographic printing plates, which results from plate cutting of one or more flexographic printing original plates, are affixed onto one or more sleeves or printing cylinders.

(56) The method according to any one of (34) to (55), further comprising a testing step of testing the flexographic printing original plate after the developing step and/or the flexographic printing plate after the plate cutting step, using an image captured by a camera.

(57) The method according to (56), wherein the testing step tests the flexographic printing original plate and/or the flexographic printing plate based on information written in the writing step.

(58) The method according to any one of (34) to (57), further comprising a step of transferring, from a stocker that stores a flexographic printing original plate before the writing step, the flexographic printing original plate, removing a cover film, and supplying the flexographic printing original plate to the writing device.

Advantageous Effects of Invention

According to the present invention, it is possible to shorten the time required for making flexographic printing original plates and stabilize the quality of the resulting flexographic printing original plates.

BRIEF DESCRIPTION OF DRAWINGS

FIG. 5 is a diagram showing an example of association between an identification number and plate cutting information.

DESCRIPTION OF EMBODIMENTS

Figure 1:
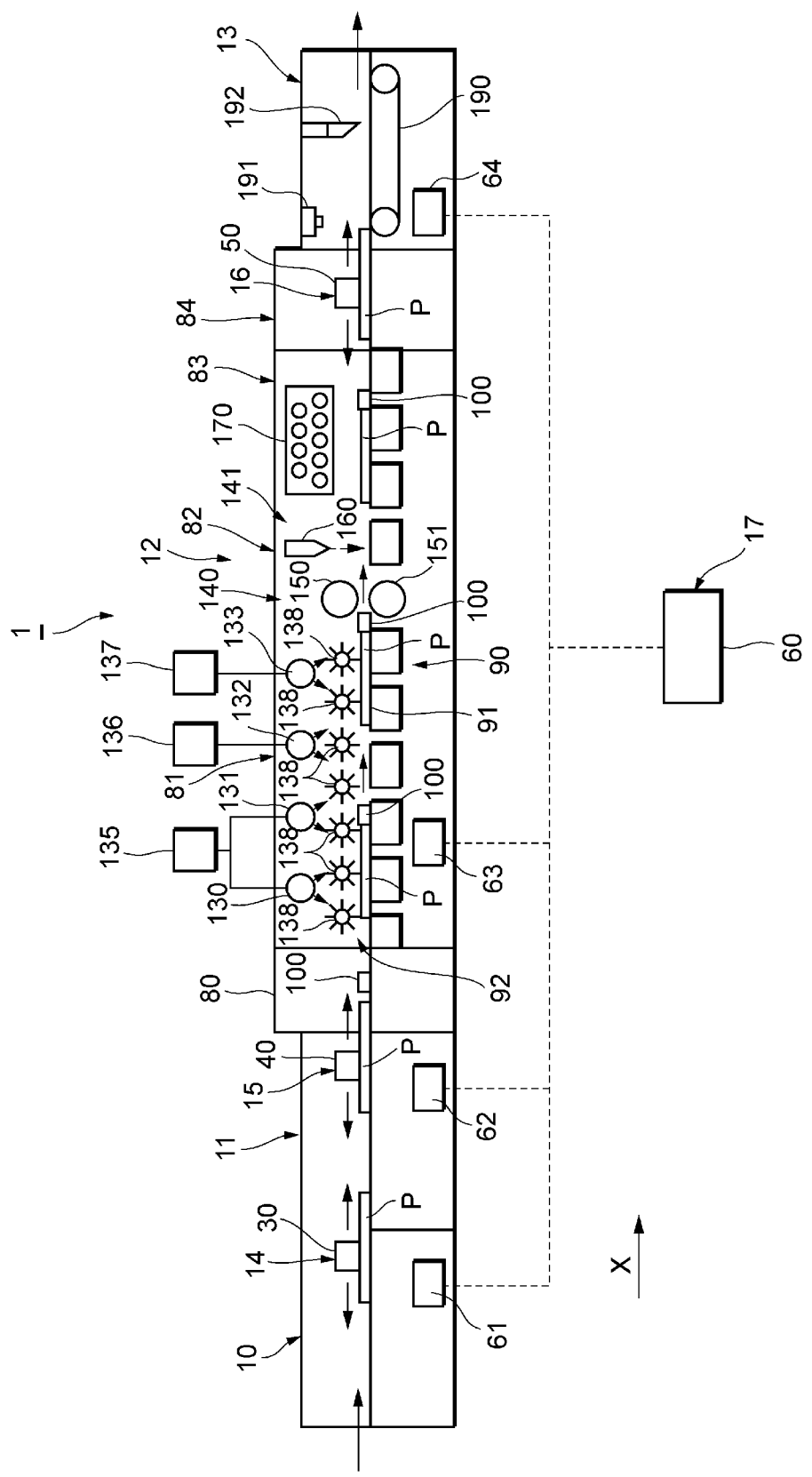
FIG. 1 is a schematic diagram showing an example of a configuration of a plate making system according to a first embodiment.

Now, preferred embodiments of the present invention will be described below with reference to the attached drawings. Like elements will be denoted by like reference numerals, and redundant explanations will be omitted. The positional relationships, such as upper, lower, right and left, are based on the positional relationship shown in the drawings, unless otherwise indicated. In addition, the dimensional ratios in the drawings are not limited to those shown in the drawings. The following embodiments are merely examples for describing the present invention, and the present invention is not limited to those embodiments.

First Embodiment

Overall System Configuration

FIG. 1 is a schematic diagram showing the outline of a configuration of a plate making system 1 of a flexographic printing original plate P (which may also be simply referred to as "a plate" in some contexts) according to the present embodiment. The plate making system 1 includes, in an integrated manner: a writing device 10 that applies laser writing onto a flexographic printing original plate P; an exposure device 11 that exposes the flexographic printing original plate P subjected to the laser writing; a developing device 12 that develops the exposed flexographic printing original plate P; a plate cutting device 13 that cuts the developed flexographic printing original plate P; a first transfer device 14 that transfers the flexographic printing original plate P subjected to the laser writing by the writing device 10 to the exposure device 11; a second transfer device 15 that transfers the flexographic printing original plate P exposed by the exposure device 11 to the developing device 12; and a third transfer device 16 that transfers the flexographic printing original plate P developed by the developing device 12 to the plate cutting device 13. The plate making system 1 further includes a control device 17 that controls a series of plate making processes for the flexographic printing original plate P performed by the writing device 10, the exposure device 11, the developing device 12 and the plate cutting device 13.

The writing device 10, the exposure device 11, the developing device 12 and the plate cutting device 13 are arranged in a linear manner and are continuously connected to each other in one direction. In this specification, the direction in which the writing device 10, the exposure device 11, the developing device 12 and the plate cutting device 13 of the plate making system 1 are arranged in the order mentioned (the rightward direction in FIG. 1) will be referred to as "the transfer direction X." Further, the writing device 10 side of the plate making system 1 will be referred to as an inlet side and the plate cutting device 13 side will be referred to as an outlet side. In addition, the horizontal direction which is orthogonal to the transfer direction X of the plate making system 1 will be referred to as the "width direction."

The writing device 10 may include, for example, an operation table, a rotary drum having clamps, and a laser emission part, and the writing device 10 is configured to allow a flexographic printing original plate to be wound around the drum with one end thereof held in a clamp and the other end thereof held in a clamp, and to then emit laser light to remove an infrared-sensitive layer so as to write a desired image on the infrared-sensitive layer laminated on a photosensitive resin layer of the flexographic printing original plate P. The writing device 10 may have a function of automatically setting the flexographic printing original plate P which has been prepared on the operation table onto the rotary drum having the clamps, and a function of removing the flexographic printing original plate P from the clamp and the rotary drum after the writing and returning it onto the operation table.

The exposure device 11 may include, for example: an exposure table; a main exposure unit that emits ultraviolet light to the photosensitive layer side of the flexographic printing original plate P, which has been subjected to laser writing, in order to form relief through the infrared-sensitive layer of the flexographic printing original plate P on which the laser writing has been applied; and a back-exposure unit that emits ultraviolet exposure light for curing an underlying layer of the photosensitive resin layer which is located on a supporter, the underlying layer serving as a back surface on which relief is formed through the exposure table from the supporter backside of the flexographic printing original plate P. The main exposure unit and the back exposure unit each have a UV-LED having the emission wavelength in a UVA range and these exposure units are capable of performing exposure while reciprocating in the transfer direction X. It is preferable for the back exposure unit and the main exposure unit to perform exposure in a cooperative manner so as to first cause the back exposure unit to perform exposure from the supporter backside and then cause the main exposure unit to perform exposure from the photosensitive layer side. The moving speed of the exposure units and the number of times to reciprocate and perform exposure are controlled depending on the type and thickness of the flexographic printing original plate P, which makes it possible to perform exposure suitable for the type and thickness of the flexographic printing original plate P and cure the photosensitive resin layer.

The developing device 12 is configured to perform: a developing step of removing an unexposed portion, excluding the exposed portion by the exposure device 11, in the flexographic printing original plate P using a developer; a drying step of drying the developed flexographic printing original plate P; and a post-exposure step of performing post-exposure for the dried flexographic printing original plate P. While the writing device 10, the exposure device 11 and the plate cutting device 13 each process one flexographic printing original plate P at a time, the developing device 12 can simultaneously process a plurality of flexographic printing original plates P in a continuous manner while sequentially transferring the plurality of flexographic printing original plates P.

The plate cutting device 13 is configured to cut the flexographic printing original plate P after completion of the developing process into a desired number of pieces of a desired shape and a desired size.

The first transfer device 14 has a suction arm 30 that may move in, for example, the transfer direction X, so that the first transfer device 14 can suction the flexographic printing original plate P, which has been subjected to the writing process by the writing device 10, with the suction arm 30, and transfer it to the exposure device 11.

The second transfer device 15 has a suction arm 40 which may move, in, for example, the transfer direction X, so that the second transfer device 15 can suction the flexographic printing original plate P, which has been subjected to the exposure process by the exposure device 11, with the suction arm 40, and transfer it to the developing device 12. The transfer device 14 and the transfer device 15 may be configured as a single device or separate devices.

The third transfer device 16 has a suction arm 50 which may move in, for example, the transfer direction X, so that the third transfer device 16 can suction the flexographic printing original plate P, which has been subjected to the developing process by the developing device 12, with the suction arm 50, and transfer it to the plate cutting device 13.

The control device 17 may include, for example: a system control unit 60 configured to control a plurality of devices so as to control the entire plate making system; and device control units 61, 62, 63, 64 provided for the writing device 10, the exposure device 11, the developing device 12 and the plate cutting device 13, respectively, and configured to control the respective devices 10-13. The system control unit 60 and the device control units 61-64 are computers capable of controlling the drive of the respective driving units of the devices 10-13 and the transfer devices 14-16, upon a CPU's execution of programs stored in a memory, thereby controlling a series of plate making processes for the flexographic printing original plate P.

<Configuration of Developing Device>

The developing device 12 may include, for example, an entrance 80, a developing unit 81, a drying unit 82, a post-exposure unit 83 and an exit 84 which are arranged in a linear manner from the inlet side to the outlet side (in the transfer direction X) in the order mentioned. The developing device 12 also includes a transfer device 90 that transfers the flexographic printing original plate P.

The transfer device 90 is configured to transfer the flexographic printing original plate P that has been transferred from the exposure device 11 into the entrance 80 to the developing unit 81, the drying unit 82, the post-exposure unit 83 and the exit 84, in the order mentioned, at a constant speed. The transfer device 90 may include, for example, a transfer path 91 that carries the flexographic printing original plate P and a conveying mechanism 92 that holds and conveys the flexographic printing original plate P on the transfer path 91. The transfer path 91 extends in a linear manner from the entrance 80 to the exit 84 of the developing device 12 in the transfer direction X. The conveying mechanism 92 may include, for example, a plurality of plate setters 100 that hold and transfer the flexographic printing original plate P.

Figure 2:
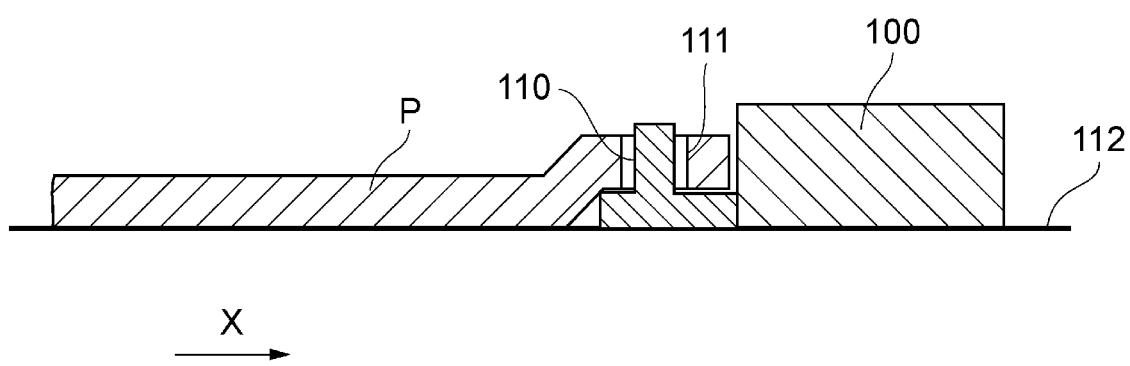
FIG. 2 is an illustration showing a configuration of a plate setter.

The plate setters 100 each have an elongated shape that elongates in the width direction of the plate making system 1. The plate setter 100 includes a plurality of pins aligned in the width direction of the plate making system 1 and is capable of holding the flexographic printing original plate P with the pins 110 being inserted into insertion holes 111 provided in a front portion of the flexographic printing original plate P as shown in, for example, FIG. 2. The plate setter 100 is mounted to a drive device (not shown) and the plate setter 100 can move from the entrance 80 to the exit 84 of the developing device 12 at a constant speed due to the drive device. The plate setter 100 and the flexographic printing original plate P are configured to be relatively moveable in the vertical direction in relation to a loading surface 112 of the flexographic printing original plate P, at the entrance 80 and the exit 84. The flexographic printing original plate P can be held at the entrance 80 by, for example, inserting the pins 110 of the plate setter 100 into the insertion holes 111 in the flexographic printing original plate P from below or allowing the flexographic printing original plate P to receive the pins 110 of the plate setter 100 from above, and the flexographic printing original plate P can be detached at the exit 84 by removing the pins 110 of the plate setter 100 from the insertion holes 111 in the flexographic printing original plate P or removing the flexographic printing original plate P from the plate setter 100.

As shown in FIG. 1, the developing unit 81 is a device that performs water development primarily using a water-based developer as a solvent of a developer. The water-based developer is a solution obtained by mixing water and a developer concentrate having at least a surfactant. An alkaline compound or other additives may further be added to the water-based developer. The developing unit 81 have a plurality (e.g., three) of developer supplying units 130, 131, 132 and a rinsing solution supplying unit 133. The developer supplying units 130-132 and the rinsing solution supplying unit 133 are arranged in the order mentioned in the transfer direction X along the transfer path 91. The developer supplying units 130-132 can discharge the developer that has been supplied from each of developer sources 135, 136 onto the flexographic printing original plate P that is moving on the transfer path 91. The developer supplying units 130 and 131 may discharge, for example, a developer obtained by mixing a used developer and an unused new developer. The developer supplying unit 132 may discharge, for example, an unused new developer. Here, as the used developer, the developer that has been used in, for example, the developing unit 81 is collected for reuse. In the case of water development, the rinsing solution supplying unit 133 may discharge a rinsing solution, such as water, supplied from a rinsing solution source 137 onto the flexographic printing original plate P that is moving on the transfer path 91.

The developing unit 81 has a plurality of brushes 138 arranged in the transfer direction X along the transfer path 91. Each brush 138 is capable of coming into contact with a surface of the flexographic printing original plate P moving on the transfer path 91 and removing undesired objects on the surface.

The drying unit 82 may include, for example, a wiping unit 140 and a blower unit 141 in the order mentioned in the transfer direction X. The wiping unit 140 may include, for example, vertically arranged rollers 150 and 151 and the wiping unit 140 can allow the flexographic printing original plate P to pass between the rollers 150, 151 to scrape off liquid that has adhered onto the surface of the flexographic printing original plate P. The blower unit 141 has a blower knife 160 and the blower unit 141 can blow the air from the blower knife 160 onto the surface of the flexographic printing original plate P to remove the liquid on the flexographic printing original plate P.

The post-exposure unit 83 has two types of exposure lamps 170—a UVA exposure lamp and a UVC exposure lamp—and the post-exposure unit 83 can apply post-exposure to the flexographic printing original plate P by causing the exposure lamps 170 to irradiate the flexographic printing original plate P with ultraviolet light that emits in the UVA and UVC ranges.

Configuration of Plate Cutting Device

The plate cutting device 13 may include, for example, a conveyor 190 that moves the flexographic printing original plate P that has been transferred from the developing device 12 by the third transfer device 16 in the transfer direction X, a camera 191 that captures an image of the flexographic printing original plate P for the alignment purpose, a cutter 192 that cuts the flexographic printing original plate P, etc.

Configuration of Control Device

The control device 17 manages a series of plate making processes so that a desired plate cutting can be performed by the plate cutting device 13 with respect to the flexographic printing original plate P which has been subjected to laser writing by the writing device 10. More specifically, the control device 17 manages the flexographic printing original plates P which have been processed by the writing device 10 such that an incorrect flexographic printing original plate P will not be handled in the plate cutting process by the plate cutting device 13.

Figure 3:
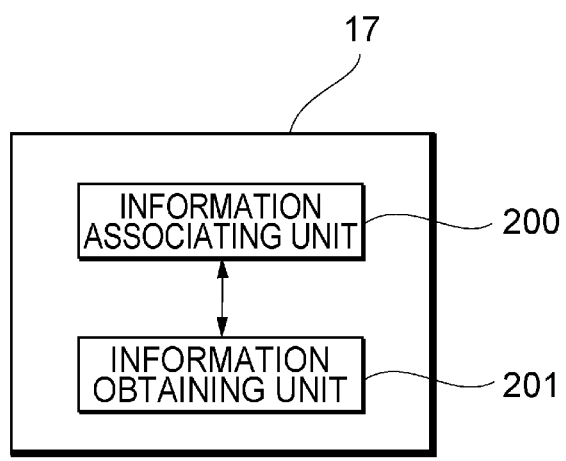
FIG. 3 is a block diagram showing a control device.

As shown in FIG. 3, the control device 17 includes: an information associating unit 200 that associates an identification of the flexographic printing original plate P to be subjected to the laser writing by the writing device 10 with plate cutting information, related to this flexographic printing original plate P, for causing a desired plate cutting to be performed by the plate cutting device 13; and an information obtaining unit 201 that obtains the identification of the flexographic printing original plate P to be subjected to plate cutting by the plate cutting device 13 and obtains, based on the obtained identification, the plate cutting information that has been associated with the obtained identification by the information associating unit 200, the plate cutting device 13 being configured to cut the flexographic printing original plate P based on the plate cutting information obtained by the information obtaining unit 201. The information obtaining unit 201 may obtain, for example, the identification which has been sequentially transmitted from the writing device 10 to the exposure device 11, to the developing device 12 and to the plate cutting device 13.

The control device 17 may include, for example, physical configurations such a control unit including a Central Processing Unit (CPU) and a memory, an operation unit, a display, a speaker, a storage unit and a communication unit. Upon the CPU's execution of a predetermined program stored in the memory, each function of the information associating unit 200 and the information obtaining unit 201 is exercised. The information associating unit 200 and the information obtaining unit 201 are exercised when a program is executed by a CPU of any of the system control unit 60 and the device control units 61-64; for example, the information associating unit 200 may be executed by the device control unit 61 of the writing device 10, and the information obtaining unit 201 may be executed by the device control unit 64 of the plate cutting device 13.

The following description will describe an example of a plate making method of a flexographic printing original plate P using the plate making system 1 having the above-described configuration.

Plate Making Processes

First, a flexographic printing original plate P is delivered to the writing apparatus 10 of the plate making system 1 shown in FIG. 1 and subjected to laser writing. The flexographic printing original plate P is then transferred to the exposure device 11 by the first transfer device 14 and subjected to an exposure process. After completion of the exposure process, the flexographic printing original plate P is transferred by the second transfer device 15 to the entrance 80 of the developing device 12. It should be noted that, when the laser writing process for one flexographic printing original plate P is completed at the writing device 10 and such flexographic printing original plate P is transferred to the exposure device 11, the next flexographic printing original plate P is delivered to the writing device 10. In this way, a plurality of flexographic printing original plates P are continuously and sequentially processed in the present plate making processes.

The flexographic printing original plate P transferred into the entrance 80 of the developing device 12 is held by the plate setter 100, transferred by the plate setter 100 to the developing unit 81, the drying unit 82, the post-exposure unit 83 and the exit 84, in the order mentioned, along the transfer path 91 at a constant speed, and then subjected to a developing process during this transfer. First, in the developing unit 81, a developer is supplied from the developer supplying unit 130, 131 and 132, in the order mentioned, onto the flexographic printing original plate P, and a rinsing solution is then supplied from the rinsing solution supplying unit 133 onto the flexographic printing original plate P. During the supply of the developer and the rinsing solution, the brush 138 is brought into contact with the flexographic printing original plate P and undesired objects on the surface of the flexographic printing original plate P are scraped and removed by the brush 138.

In the drying unit 82, the flexographic printing original plate P is first transferred to the wiping unit 140 and passed between the rollers 150, 151, where the liquid on the flexographic printing original plate P is scraped off. The flexographic printing original plate P is then transferred to the blower unit 141, where the liquid on the flexographic printing plate P is blown away and removed by the air from the blower knife 160.

In the post-exposure unit 83, the exposure lamp 170 irradiates the flexographic printing original plate P with ultraviolet light that emits in the UVA and UVC ranges, so that the flexographic printing original plate P is post-exposed. The flexographic printing original plate P is then transferred to the exit 84 and stopped. In this way, the developing process is completed.

The plate setter 100 is detached from the flexographic printing original plate P transferred to the exit 84 and the flexographic printing original plate P is then transferred to the plate cutting device 13 by the third transfer device 16. In the plate cutting device 13, the flexographic printing original plate is placed at a predetermined position by the conveyor 190 and captured by the camera 191. Based on the position of the flexographic printing original plate P based on the image of the flexographic printing original plate P, the flexographic printing original plate P is subjected to plate cutting by the cutter 192. A flexographic printing plate resulting from the plate cutting is sent to the outlet side by the conveyor 190 so that it can be transferred out of the plate cutting device 13. In this way, a series of plate making processes is completed. The series of plate making processes described above is controlled by the control device 17. In this specification, the plate in and before the plate cutting process is referred to as a flexographic printing original plate, whereas the plate after the plate cutting process is referred to as a flexographic printing plate.

Management Control

Figure 4:
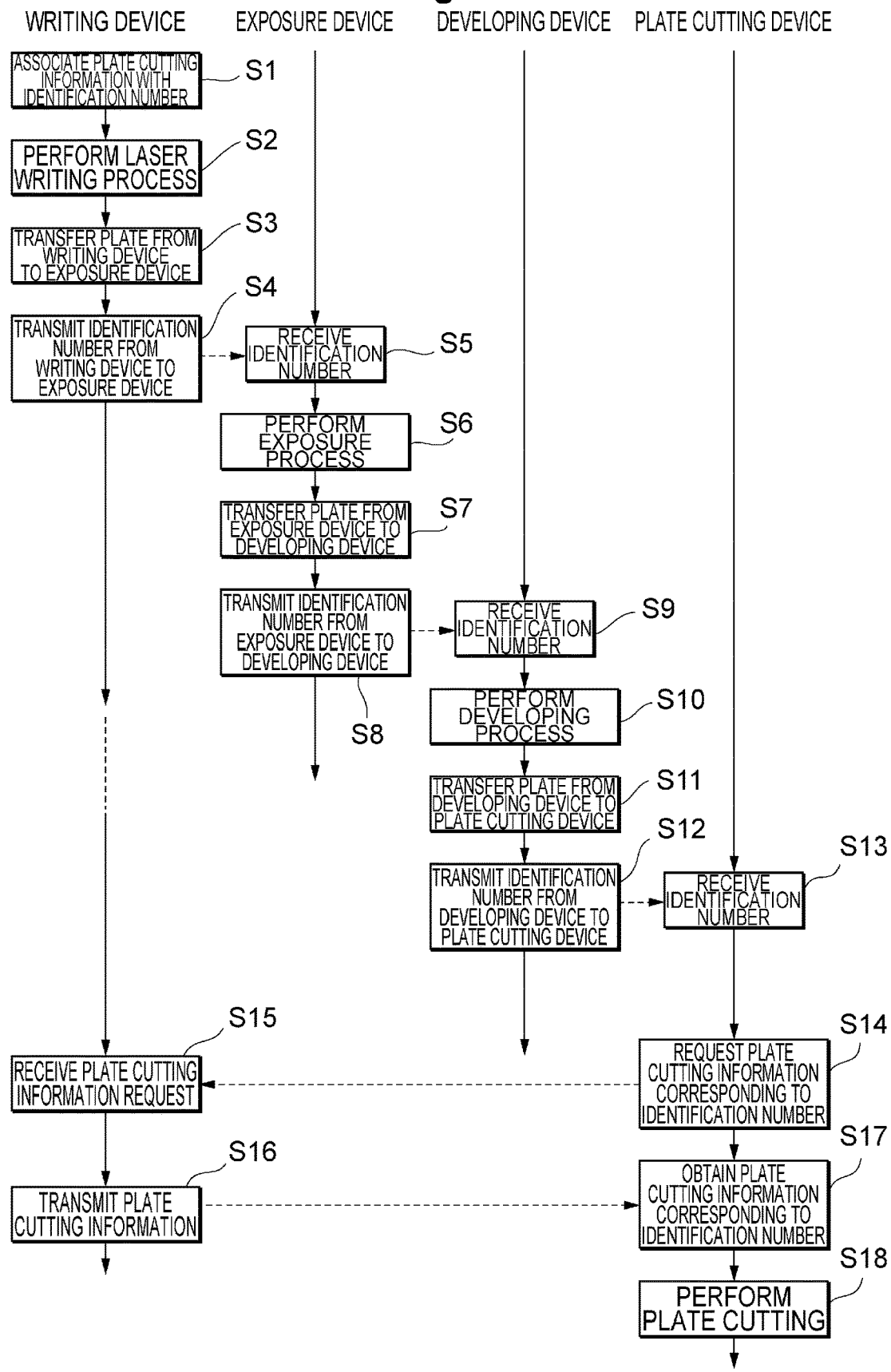
FIG. 4 is a flowchart showing a management control.

In the plate making processes described above, a series of plate making processes is managed so that a desired plate cutting can be performed by the plate cutting device 13 with respect to the flexographic printing original plate P which has been subjected to laser writing by the writing device 10. The following description will describe an example of such management control. FIG. 4 shows an example flow of such management control.

First, in the writing device 10, an identification number, being an identification of a flexographic printing original plate P to be subjected to the laser writing by the writing device 10 is associated with plate cutting information of a plate cutting to be applied to the flexographic printing original plate P by the plate cutting device 13 (step S1 in FIG. 4). This association is performed by the information associating unit 200. The information to be associated may, for example, be created by the writing device 10 based on externally-input information and stored in the device control unit 61 of the writing device 10. More specifically, as shown in FIG. 5, an identification number (e.g., 1-5) which is provided for each flexographic printing original plate P is associated with plate cutting information (e.g., A-E) to be applied to each flexographic printing original plate P corresponding to each identification number. The plate cutting information may include, for example, the position, size, shape, number, etc. of the plate cutting.

Next, as shown in FIG. 4, the laser writing process is performed by the writing device 10 (step S2) and, when the laser writing process is completed, the flexographic printing original plate P is transferred from the writing device 10 to the exposure device 11 (step S3). At this time, the identification number (e.g., identification number 1) of the flexographic printing original plate P is transmitted from the writing device 10 to the exposure device 11 (step S4).

In the exposure device 11, the identification number "1" is received (step S5) and stored in the device control unit 62. The exposure process is performed by the exposure device 11 (step S6) and, when the exposure process is completed, the flexographic printing original plate P is transferred from the exposure device 11 to the developing device 12 (step S7). At this time, the identification number "1" of the flexographic printing original plate P is transmitted from the exposure device 11 to the developing device 12 (step S8).

In the developing device 12, the identification number "1" is received (step S9) and stored in the device control unit 63. The developing process is performed by the developing device (step S10) and, when the developing process is completed, the flexographic printing original plate P is transferred from the developing device 12 to the plate cutting device 13 (step S11). At this time, the identification number "1" of the flexographic printing original plate P is transmitted from the developing device 12 to the plate cutting device 13 (step S12).

In the plate cutting device 13, the identification number "1" is received (step S13) and stored in the device control unit 64. The plate cutting device 13 requests, from the writing device 10, the plate cutting information (e.g., plate cutting information "A") corresponding to the received identification number "1" (step S14). Upon receiving a request signal for the plate cutting information, the writing device 10 sends the plate cutting information "A" corresponding to the identification number "1" to the plate cutting device 13 (step S15) and the plate cutting device 13 receives the plate cutting information "A" (step S16). Such obtaining of the plate cutting information "A" is performed by the information obtaining unit 201.

Based on the received plate cutting information "A," the plate cutting device 13 performs plate cutting for the relevant flexographic printing original plate P (step S17). With such configuration, even when a plurality of flexographic printing original plates P are simultaneously processed in the writing device 10, the exposure device 11, the developing device 12 and the plate cutting device 13, a desired plate cutting for each flexographic printing original plate P can be performed without mistakes.

According to the present embodiment, the plate making system 1 includes the writing device 10, the exposure device 11, the developing device 12, the plate cutting device 13, the first transfer device 14, the second transfer device 15 and the third transfer device 16 in an integrated manner, and further includes the control device 17 for controlling a series of plate making processes for a flexographic printing original plate P performed by the writing device 10, the exposure device 11, the developing device 12 and the plate cutting device 13. Thus, unlike conventional plate making systems, there is no need for an operator to transfer a flexographic printing original plate P between the devices and the series of plate making processes can be performed automatically, and it is therefore possible to shorten the time required for making the flexographic printing original plate P. In addition, since it is also possible to perform the series of plate making processes while controlling each of the plate making conditions that affect the plate quality, such as a time period from the laser writing to the exposure, a time period from the exposure to the development and a lamp temperature during exposure, within a certain range, it is possible to stabilize the qualities of the flexographic printing original plate P, such as a dot shape and a relief depth, which affect printing. Furthermore, since a series of plate making processes are controlled, various conditions related to a series of plate making processes can easily be fed back from plates that have been made in the past or from printed matters resulting from such plates.

Since the control device 17 includes the device control units 61-64 configured to control the respective devices and the system control unit 60 configured to control the entire plate making system by controlling the plurality of devices, recognition control for a plurality of flexographic printing original plates P is performed by the system control unit 60 while the control for the devices is separately performed by the respective device control units 61-64; thus, it is possible to simplify the control and enhance the stability of the system, in relation to the construction of the entire system as a unit, to thereby appropriately perform a series of process making processes in which a plurality of flexographic printing original plates P are processed by a plurality of devices.

Since the writing device 10, the exposure device 11, the developing device 12 and the plate cutting device 13 are arranged in a linear manner, a constant direction cat be set as the transfer direction X for the flexographic printing original plate P, whereby the configuration of the plate making system 1 can be simplified and the size reduction and the cost reduction of the plate making system 1 can be achieved.

The control device 17 is configured to manage a series of plate making processes so that a desired plate cutting can be performed by the plate cutting device 13 with respect to the flexographic printing original plate P which has been subjected to laser writing by the writing device 10. With such configuration, even if a plurality of flexographic printing original plates P are simultaneously and continuously processed in the plate making system 1, desired plate cutting can still be performed for each flexographic printing original plate P.

The control device 17 includes: the information associating unit 200 that associates an identification (identification number) of the flexographic printing original plate P to be subjected to the laser writing by the writing device 10 with plate cutting information, related to this flexographic printing original plate P, for causing desired plate cutting to be performed by the plate cutting device 13; and the information obtaining unit 201 that obtains the identification of the flexographic printing original plate P to be subjected to plate cutting by the plate cutting device 13, and obtains, based on the obtained identification, the plate cutting information that has been associated with the obtained identification by the information associating unit 200, the plate cutting device 13 being configured to cut the flexographic printing original plate P based on the plate cutting information obtained by the information obtaining unit 201. With such configuration, the management control for causing a desired plate cutting to be performed in the plate cutting device 13 can be performed appropriately.

The information obtaining unit 201 is configured to obtain the identification which has been sequentially transmitted from the writing device 10, to the exposure device 11, to the developing device 12 and to the plate cutting device 13. With such configuration, the management control for causing a desired plate cutting to be performed in the plate cutting device 13 can be performed easily and securely.

Various information including the identification of the flexographic printing original plate P may be transmitted to the system control unit 60 that controls the entire plate making system and to each of the device control units 61-63. In such case, the identification of the flexographic printing original plate P is directly transmitted from the device control unit 61 that controls the writing device 10 to the device control unit 62 that controls the exposure device 11, from the device control unit 62 that controls the exposure device 11 to the device control unit 63 that controls the developing device 12, and from the device control unit 63 that controls the developing device 12 to the device control unit 64 that controls the plate cutting device 13, such that, after a necessary step is completed in each device, the next step can be performed by the next device. The identification of the flexographic printing original plate P is also delivered to each device through the system control unit 60 that controls the entire system.

The plate making system 1 according to the present invention continuously makes a plurality of flexographic printing original plates P. In such process, in order to minimize the time loss during each step in each device or between the devices, for example, information about the start of the exposure step for a certain flexographic printing original plate P and information that permits the writing step for the next flexographic printing original plate P to start are transmitted directly from the device control unit 62 of the exposure device 11 to the device control unit 61 of the writing device 10 and/or through the system control unit 60, so that, when the exposure step for the certain flexographic printing original plate P is started at the exposure device 11, the writing step for the next flexographic printing original plate P can be started at the writing device 10. In the same way, the information that permits the exposure step for the next flexographic printing original plate P to start is transmitted directly from the device control unit 63 of the developing device 12 to the device control unit 62 of the exposure device 11 and/or through the system control unit 60 at the timing when the developing step for the certain flexographic printing original plate P is started at the developing device 12 and it becomes possible to start the exposure step for the next flexographic printing original plate P at the exposure device 11. In addition, since the developing device 12 is capable of simultaneously performing the development, drying and post-exposure for a plurality of plates, information that indicates the acceptable state for the next flexographic printing original plate P is transmitted directly from the device control unit 64 of the plate cutting device 13 to the device control unit 63 of the developing device 12 and/or through the system control unit 60, at the timing when it becomes possible for the plate cutting device 13 to accept the next flexographic printing original plate P. In this way, a combined type system is constructed, in which various types of information, such as the identifications of flexographic printing original plates P, the information that permits the start of the next step for the next flexographic printing original plate P, and the information that indicates the acceptable state for the next flexographic printing original plate P at the next step, are transferred to the device control units 61-64 of the respective devices through the system control unit 60, while the information is also directly transmitted between the devices. In other words, the identification of the flexographic printing original plate is transmitted through a combined route comprising a direct route between the writing device 10 and the exposure device 11, between the exposure device 11 and the developing device 12, and between the developing device 12 and the plate cutting device 13, and/or a route through the entire system including the plurality of devices 11-13 and the control device 17. Such configuration can shorten the standby time between the devices. In addition, it is also possible to improve the stability of the plate making system such that the entire system will not immediately stop even when an error occurs in information transmission or an error occurs in part of the steps performed by the respective devices.

The developing device 12 is configured to successively perform the development using a developer, drying and post-exposure during the transfer using the same transfer device 90. With such configuration, the structure of the developing device 12 can be simplified and the size reduction and cost reduction of the developing device 12 can be achieved. In addition, it becomes easier to manage a series of developing processes in the developing device 12 and therefore becomes possible to improve the quality of the developing processes.

The developing device 12 performs the development, drying and post-exposure as an integrated unit. The developing device 12 includes a plate setter 100 for transferring the flexographic printing original plate P at a constant speed, a device for attaching the plate setter 100 to the flexographic printing original plate P is provided at the entrance 80 of the unit of the developing device 12, and a device for detaching the plate setter 100 from the flexographic printing original plate P is provided at the exit 84 of the unit of the developing device 12. With such configuration, it is possible to appropriately transfer the flexographic printing original plate P into or out of the developing device 12 and appropriately transfer the flexographic printing original plate P within the developing device 12.

It is preferable for the development performed by the developing device 12 to be water development. Development using an organic solvent causes the resulting plate to contain the organic solvent and therefore requires a drying step. Such drying step is much longer than the developing step and, in order to automatically and continuously make a plurality of plates, the developing device 12 would separately require a drying unit for simultaneously drying a plurality of plates and a transfer device for transferring the plates to such drying unit, thereby resulting in a large and complex device. In addition, in heat development in which flexographic printing original plates are heated and wiped with a nonwoven fabric cloth, a used nonwoven fabric cloth has to be replaced with an unused nonwoven fabric cloth at regular time intervals, and the continuous plate making processes have to be stopped during such replacement. Since the water development using a water-based developer allows for the drying of the flexographic printing original plate P to be conducted more easily than the organic solvent development and only requires the blower knife 160 to conduct such drying, the water development is suitable for a plate making system having the development, drying and post-exposure functions in an integrated manner. In the case of the organic solvent development, the flexographic printing original plate expands with the organic solvent and contracts when dried, and in the case of heat development, not only the photosensitive resin layer but also the support of the flexographic printing original plate expand due to heat and their dimensions are also changed when cooled after the completion of development; thus, strict development conditions and drying conditions have to be set. On the other hand, in the case of water development, the degree of expansion and contraction of the flexographic printing original plate P is small, the development conditions and the drying conditions can be set in an easy and uniform manner and, in such aspect as well, the water development is also suitable for a plate making system having the development, drying and post-exposure functions in an integrated manner.

Other Modes of Management Control

Regarding the management control for a series of plate making processes in the above embodiment, other modes may be employed.

Other Mode 1

The writing device 10 may, for example, be configured to write the identification on the flexographic printing original plate P by way of laser writing. The writing device 13 may include, for example, the camera 191 or at least one of a CCD sensor and a barcode reader, as a reading device for reading the identification written on the flexographic printing original plate P. The barcode reader includes a light-receiving element that emits LED or laser light and reads the reflected light, whereby it is capable of reading a barcode or a QR code. The information obtaining unit 201 can read, with the camera 191 or the barcode reader, the identification written on the flexographic printing original plate P to be subjected to plate cutting by the plate cutting device 13, obtain the read identification by converting it into binary data and, based on such identification, obtain the plate cutting information that has been associated by the information associating unit 200.

Figure 6:
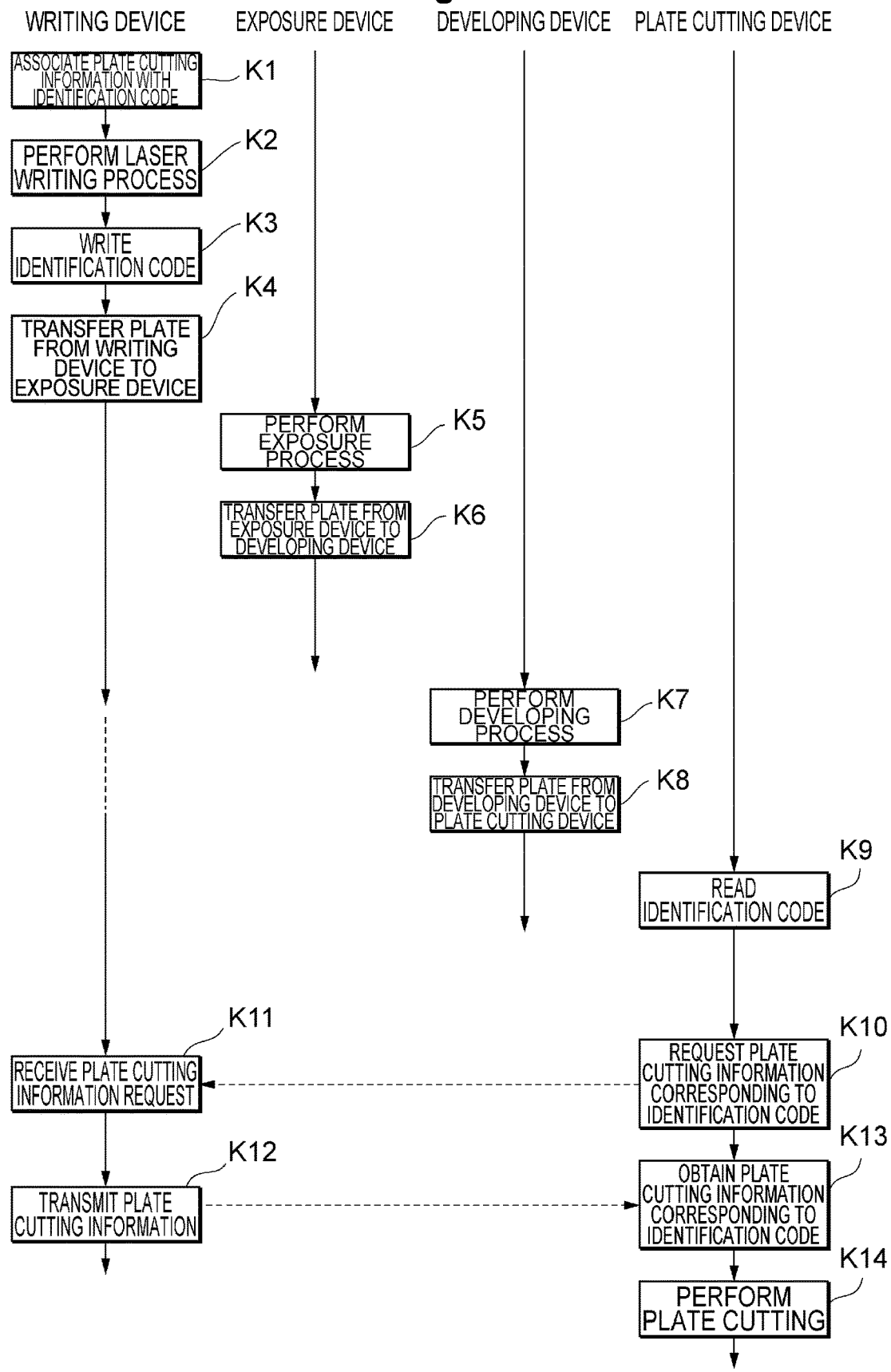
FIG. 6 is a flowchart showing a management control in another mode.
Figure 7:
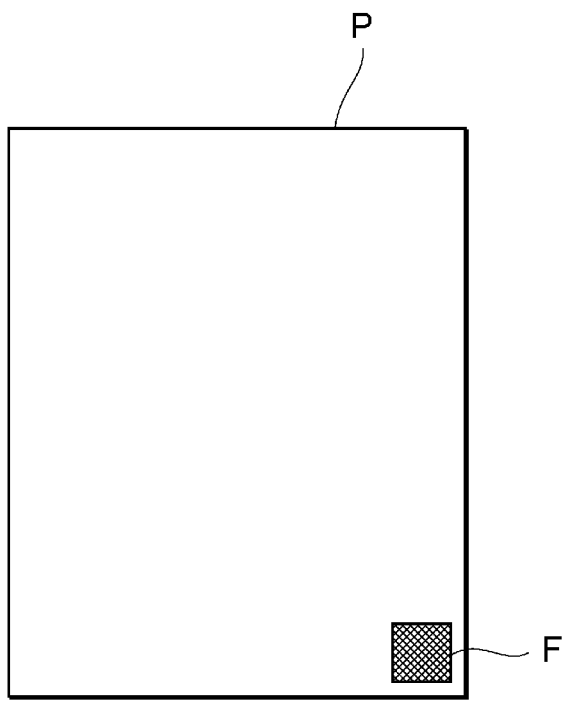
FIG. 7 is an illustration showing an example of an identification code.

FIG. 6 shows an example flow of such management control. First, in the writing device 10, an identification code, being the identification of the flexographic printing original plate P to be subjected to laser writing by the writing device 10, is associated with plate cutting information about the plate cutting to be applied to the flexographic printing original plate P in the plate cutting device 13 (step K1 in FIG. 6). Such association is performed by the information associating unit 200.

Next, in the writing device 10, a laser writing process is performed for the flexographic printing original plate P (step K2), and the identification code F, being the identification, is then laser-written on the flexographic printing original plate P (step K3). The identification code F may be written on, for example, an end of the flexographic printing original plate P. For example, a barcode or a QR code may be used as the identification code F.

Once the laser writing process is completed, the flexographic printing original plate P is transferred from the writing device 10 to the exposure device 11 (step K4).

Next, in the exposure device 11, an exposure process is performed for the flexographic printing original plate P (step K5), and once the exposure process is completed, the flexographic printing original plate P is then transferred from the exposure device 11 to the developing device 12 (step K6). In the developing device 12, a developing process is performed for the flexographic printing original plate P (step K7) and, once the developing process is completed, the flexographic printing original plate P is transferred from the developing device 12 to the plate cutting device 13 (step K8).

Next, in the plate cutting device 13, the identification code F of the flexographic printing original plate P is read by the camera 191 (step K9) and stored in, for example, the device control unit 64. The plate cutting device 13 requests, from the writing device 10, the plate cutting information corresponding to the read identification code F (step K10). Upon receipt of a request signal (step K11), the writing device 10 sends the plate cutting information corresponding to the identification code F to the plate cutting device 13 (step K12) and the plate cutting device 13 receives the plate cutting information (step K13) Such obtaining of the plate cutting information is performed by the information obtaining unit 201.

The plate cutting device 13 performs plate cutting for the flexographic printing original plate P based on the received plate cutting information (step K14).

According to the present aspect, control management for allowing a desired plate cutting to be performed at the plate cutting device 13 can be performed simply and securely.

Other Mode 2

The identification of the flexographic printing original plate P is a handling order information for flexographic printing original plates P. The plate making system 1 includes a job counter that counts the flexographic printing original plates P to be subjected to plate cutting by the plate cutting device 13. The information obtaining unit 201 can obtain, from the job counter, the handling order information for the flexographic printing original plate P to be subjected to the plate cutting by the plate cutting device 13 and obtain the plate cutting information associated by the information associating unit 200 based on the handling order information of such flexographic printing original plate P.

Figure 8:
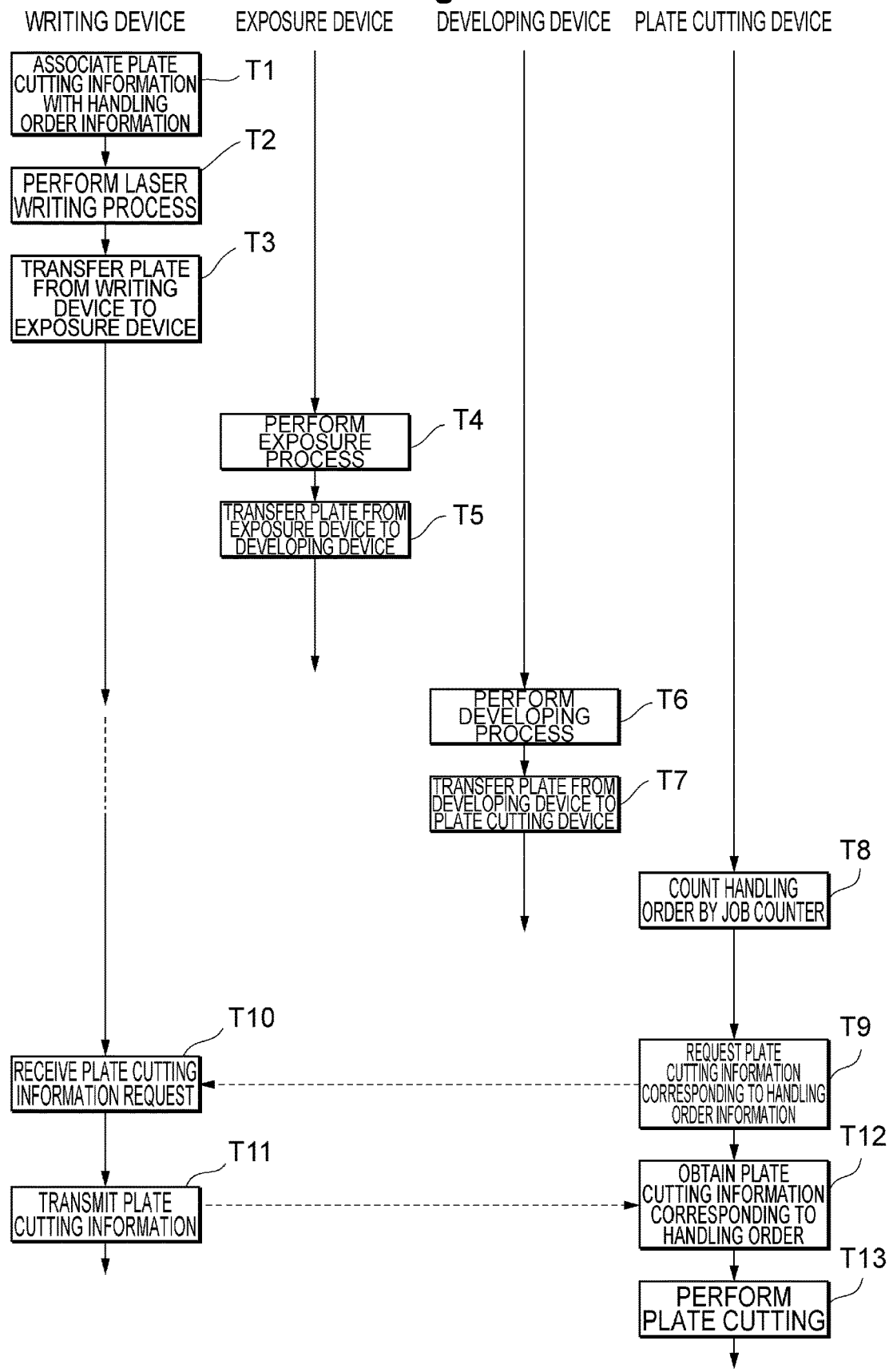
FIG. 8 is a flowchart showing a management control in a further mode.
Figure 9:
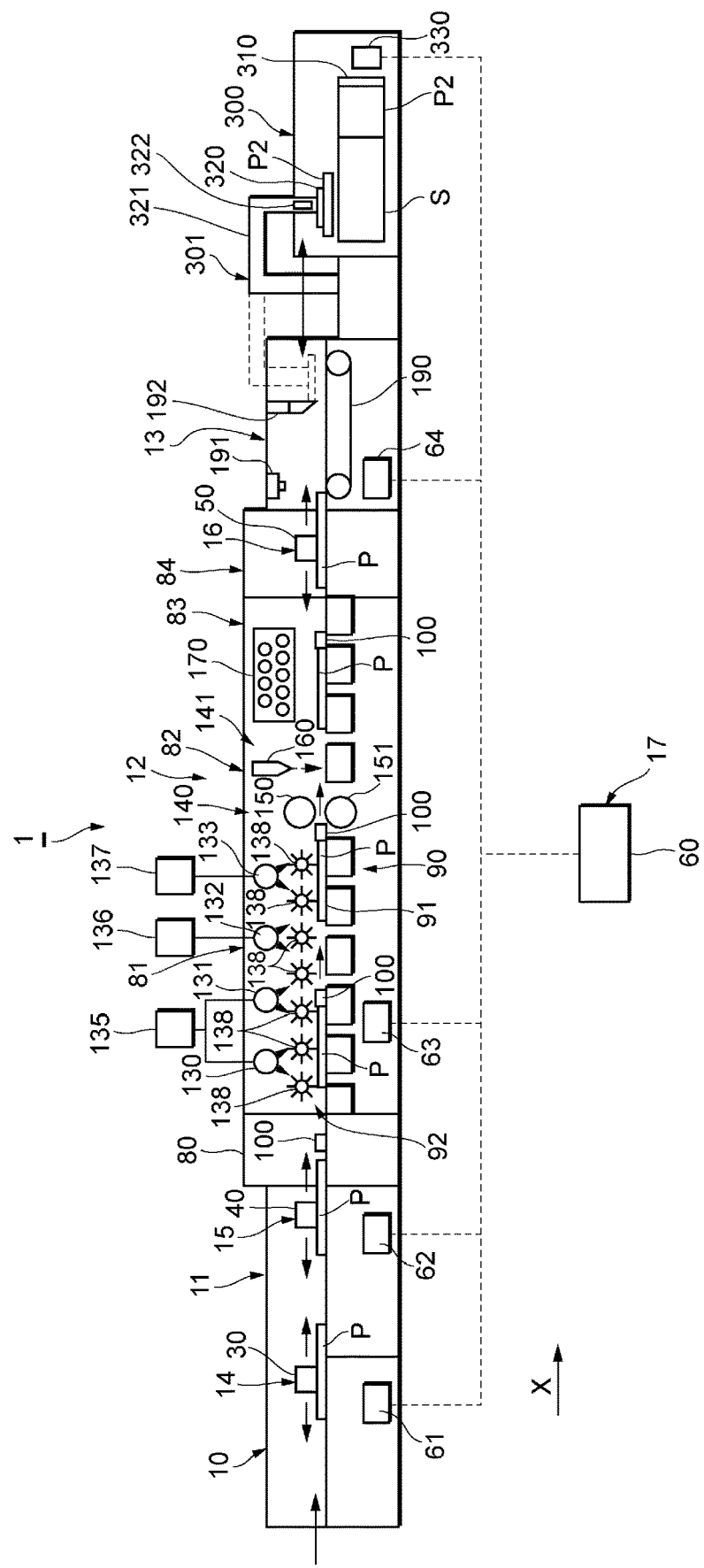
FIG. 9 is a schematic diagram showing an example of a configuration of a plate making system according to a second embodiment.

FIG. 8 shows an example flow of such management control. First, in the writing device 10, handling order information, being the identification of the flexographic printing original plate P to be subjected to laser writing by the writing device 10, is associated with plate cutting information about the plate cutting to be subjected to the flexographic printing original plate P in the plate cutting device 13 (step T1 in FIG. 8). Such association is performed by the information associating unit 200. For example, the handling order information of the flexographic printing original plate P to be processed first is No. 1 and the handling order information of the flexographic printing original plate P to be processed next is No. 2.

Next, in the writing device 10, a laser writing process is performed for the flexographic printing original plate P (step T2). Once the laser writing process is completed, the flexographic printing original plate P is transferred from the writing device 10 to the exposure device 11 (step T3).

Next, in the exposure device 11, an exposure process is performed for the flexographic printing original plate P (step T4), and once the exposure process is completed, the flexographic printing original plate P is then transferred from the exposure device 11 to the developing device 12 (step T5). Next, in the developing device 12, a developing process is performed for the flexographic printing original plate P (step T6) and, once the developing process is completed, the flexographic printing original plate P is transferred from the developing device 12 to the plate cutting device 13 (step T7).

Next, in the plate cutting device 13, the flexographic printing original plate P is counted by the job counter (step T8) and the handling order information is stored in, for example, the device control unit 64. The plate cutting device 13 requests, from the writing device 10, the plate cutting information corresponding to the handling order information of the counted flexible printing original plate P (step T9). Upon receipt of a request signal (step T10), the writing device 10 sends the plate cutting information corresponding to the handling order information to the plate cutting device 13 (step T11) and the plate cutting device 13 receives the plate cutting information (step T12) Such obtaining of the plate cutting information is performed by the information obtaining unit 201.

The plate cutting device 13 performs plate cutting for the flexographic printing original plate P based on the received plate cutting information (step T13).

According to the present aspect, a control management for allowing a desired plate cutting to be performed at the plate cutting device 13 can be performed simply and securely.

In the embodiment described above, the control device 17 may calculate a desired developing amount for the flexographic printing original plates P to be developed by the developing device 12 based on the information of the flexographic printing original plate P to be subjected to laser writing by the writing device 10 and adjust the developing capacity of the developer based on the developing amount.

For example, the writing device 10 may have stored therein the plate size information, thickness information, image information, recess depth information (RD) of a plate, etc. which have been input from the outside as the information of the flexographic printing original plate P to be subjected to laser writing by the writing device 10. The control device 17 calculates a desired developing amount (e.g., a polymer amount) in the development by the developing device 12 from at least one of such information of the flexographic printing original plate P, and adjusts the developer to be used in the developing process based on the polymer amount. When, for example, both a used developer and an unused developer are used in the developing device 12, the amount of use (usage proportion) of a new developer is adjusted. More specifically, in the above embodiment, the amount of supply of the developer including the used developer supplied from the developer supplying units 130, 131 and the amount of supply of the new developer supplied from the developer supplying unit 132 may be adjusted. Since such configuration allows the developing process to be performed using an appropriate developer suitable for the flexographic printing original plate P, the plate making quality can be improved.

The temperature of the flexographic printing original plate P in the post-exposure unit 83 of the developing device 12 may differ between immediately after the exposure lamp 170 is turned on and during its continuous lighting. Under such circumstances, the control device 17 may control the exposure lamp 170 so as to make the temperature of the flexographic printing original plate P constant during post-exposure. For example, the timing at which the exposure lamp 170 is turned on may be adjusted. As a further example, when the exposure lamp 170, which has been off, is turned on, such turning-on timing may be set earlier, by a predetermined time, than the timing of the transfer of the flexographic printing original plate P to the post-exposure unit 83, so that the temperature of the flexographic printing original plate P in the post-exposure unit 83 immediately after the exposure lamp 170 is turned on is made equal to the temperature of the flexographic printing original plate P during the continuous lighting. Since such configuration allows the post-exposure in the developing process to be performed at a constant temperature, the plate making quality can be improved. It should be noted that the control for the exposure lamp 170 in order to make the temperature of the flexographic printing original plate P constant during the post-exposure is not limited to the adjustment of the turning-on timing of the exposure lamp 170, and the light quality and other features of the exposure lamp 170 may alternatively be controlled.

Second Embodiment

The plate making system 1 of the first embodiment may further include: an affixing device 300 that affixes a flexographic printing plate P2 subjected to plate cutting onto a sleeve S with a cushioning tape attached thereon (which will also be simply referred to as "the sleeve" in some contexts); and a fourth transfer device 301 that transfers the flexographic printing plate P2 subjected to the plate cutting by the plate cutting device 13 to the affixing device 300. It should be noted that the configuration or processes of the plate making system 1 for which no specific mention will be made are the same as those in the first embodiment, and the explanation thereof will be omitted.

The plate making system 1 includes, in an integrated manner, the writing device 10, the exposure device 11, the developing device 12, the plate cutting device 13, the first transfer device 14, the second transfer device 15, the third transfer device 16, the fourth transfer device 301 and the affixing device 300. The writing device 10, the exposure device 11, the developing device 12, the plate cutting device 13 and the affixing device 300 are arranged in a linear manner and continuously connected to each other. It should be noted that the writing device 10, the exposure device 11, the developing device 12, the plate cutting device 13 and the affixing device 300 may be arranged such that an angle is formed between some of the devices.

The affixing device 300 is a device that affixes the flexographic printing plate P2 onto a sleeve S with a cushioning tape attached thereon. The affixing device 300 may be, for example, a holding unit 310 that holds the sleeve S onto which the flexographic printing plate P2 is affixed.

The fourth transfer device 301 may be, for example, a robotic arm 321 having a suction pad 320. The fourth transfer device 301 is arranged between the affixing device 300 and the plate cutting device 13 and is capable of holding the flexographic printing plate P2 subjected to the plate cutting by the plate cutting device 13 by way of suction by the suction pad 320 and transferring the flexographic printing plate P2 to the affixing device 300. The fourth transfer device 301 is further configured to transfer the held flexographic printing plate P2 onto the sleeve S of the affixing device 300, so that it can directly affix the flexographic printing plate P2 onto the rotating sleeve S.

It is preferable for the robotic arm 321 to have at least two suction pads in order to transfer the flexographic printing plate P2 after plate cutting to an accurate position. The suction pads are connected to a piping for intake and exhaust of the air. When the flexographic printing plate P2 is mounted to the robotic arm 321, the flexographic printing plate P2 can be mounted to the robotic arm 321 by pressing the suction pads onto the flexographic printing plate P2 to evacuate the air, and the flexographic printing plate P2 can be transferred in such state. A misalignment of the flexographic printing plate P2 can be reduced by introducing the air into the suction pads after moving the flexographic printing plate P2 to a predetermined accurate position. Although the material and shape of the suction pads are not limited, an elastomer material is preferable from the viewpoint of being able to follow the surface contour of the flexographic printing plate and easily reduce the pressure between the suction pads and the flexographic printing plate, as well as the viewpoint of causing less damage to the flexographic printing plate even when the suction pads are pressed onto the flexographic printing plate, and examples of the elastomer material that may be used include polybutadiene rubber, polyacrylonitrile butadiene rubber, polyurethane, silicone, fluorine rubber, etc. The size of the suction pads may also be arbitrarily selected according to the size or thickness of the flexographic printing plate after cutting.

An end of the flexographic printing plate P2 is transferred by the fourth transfer device 301 to a predetermined position above the sleeve S within the affixing device 300, the end of the flexographic printing plate P2 is attached to the sleeve S, and the flexographic printing plate P2 is detached from the suction pads while rotating the sleeve S, whereby the flexographic printing plate P2 can be affixed onto the sleeve S. Further, in order to affix the flexographic printing plate P2 onto the sleeve S with a uniform tension, the flexographic printing plate P2 may be sandwiched between the sleeve S and a roller that rotates separately from the sleeve S.

For example, the fourth transfer device 301 may have a camera 322 as a reading device that reads position information of the flexographic printing plate P2. The position information of the flexographic printing plate P2 may include, for example, information on the position and angle of the flexographic printing plate P2 with respect to the coordinate system of the fourth transfer device 301. The camera 322 may alternatively be provided in a main body of the affixing device 300, instead of in the fourth transfer device 301.

The control device 17 controls a series of plate making processes for the flexographic printing original plate P and the flexographic printing plate P2 performed by the writing device 10, the exposure device 11, the developing device 12, the plate cutting device 13 and the affixing device 300.

The control device 17 further has a device control unit 330 provided in the affixing device 300 to control this affixing device 300.

The control device 17 also manages the series of plate making process so that a desired affixing is performed in the affixing device 300 for the flexographic printing original plate P subjected to the laser writing by the writing device 10 and for the flexographic printing plate P2 subjected to plate cutting. More specifically, the control device 17 manages the plate making processes such that a correct flexographic printing original plate P subjected to the writing device 10 is subjected to affixing by the affixing device 300 and affixed to the predetermined position in the sleeve S.

Figure 10:
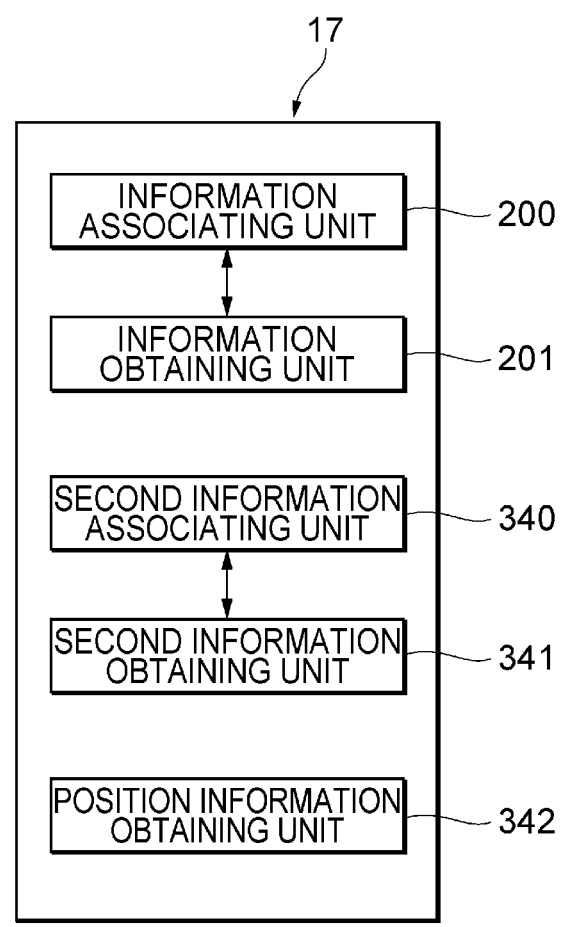
FIG. 10 is a block diagram showing a control device.

For example, the control device 17 may include, as shown in FIG. 10: a second information associating unit 340 that associates an identification of a flexographic printing original plate P to be subjected to the laser writing by the writing device 10 with affixing information, related to a flexographic printing plate P2 resulting from plate cutting of such flexographic printing original plate P, for causing a desired affixing to be performed by the affixing device 300; and a second information obtaining unit 341 that obtains an identification of the flexographic printing plate P2 to be subjected to affixing by the affixing device 300 and obtains, based on the obtained identification, the affixing information that has been associated with the obtained identification by the second information associating unit 340, the affixing device 300 being configured to affix the flexographic printing plate P2 based on the affixing information obtained by the second information obtaining unit 341. The identification of the flexographic printing original plate P at this time may be managed per a plurality of flexographic printing plates P2 which will later be produced by plate cutting. The second information obtaining unit 341 may obtain, for example, the identification which has been sequentially transmitted from the writing device 10 to the exposure device 11, to the developing device 12, to the plate cutting device 13 and to the affixing device 300. At this time, as has been described above in relation to the first embodiment, various information that includes the identification of the flexographic printing original plate P may be transmitted to the system control unit 60 that controls the entire plate making system and to each of the device control units 61-64 and 330. In other words, the identification of the flexographic printing original plate P may be transmitted through a combined route comprising a direct route between the writing device 10 and the exposure device 11, between the exposure device 11 and the developing device 12, between the developing device 12 and the plate cutting device 13, and between the plate cutting device 13 and the affixing device 300, and/or a route through the entire plate making system 1 including the plurality of devices.

The control device 17 includes a position information obtaining unit 342 that obtains position information of the flexographic printing plate P2 for affixing the flexographic printing plate P2 at a predetermined position in the sleeve S in the affixing device 300. The position information obtaining unit 342 has the above-described camera 322.

The control device 17 manages an acceptance signal for the next flexographic printing original plate P or flexographic printing plate P2 at each device and simultaneously and continuously manages the same plate making process or different plate making processes for the plurality of flexographic printing original plates P and flexographic printing plates P2 using the series of devices.

In the plate making processes of the plate making system 1 according to the second embodiment, the writing process in the writing device 10, the exposure process in the exposure device 11, the developing process in the developing device 12 and the plate cutting process in the plate cutting device 13 are performed in the order mentioned, in the same way as the first embodiment. Subsequently, the flexographic printing plate P2 that has been subjected to plate cutting by the plate cutting device 13 is transferred to the affixing device 300 by the fourth transfer device 301 and affixed to the predetermined position in the sleeve S with a cushioning tape attached thereon, whereby the series of plate making processes is completed.

Figure 11:
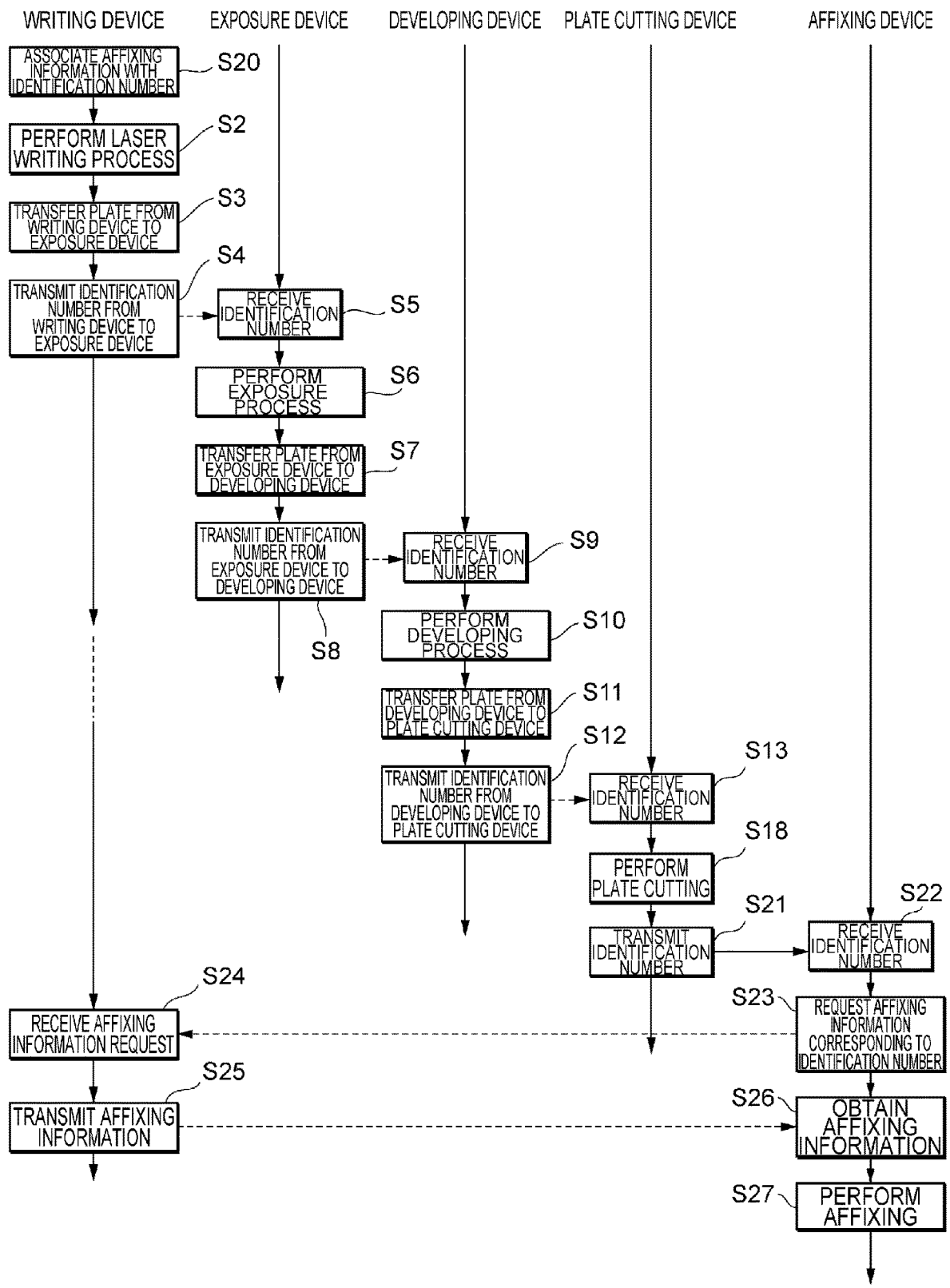
FIG. 11 is a flowchart showing a management control.

In such plate making processes, the series of plate making processes is managed so that a desired affixing is performed in the affixing device 300 for the flexographic printing original plate P subjected to the laser writing by the writing device 10. FIG. 11 shows an example flow of such management control. It should be noted that the steps for which no specific mention will be made are the same as the steps in the flow shown in FIG. 4 in the first embodiment, and the explanation of such steps will be omitted.

In such management control, first, in the writing device 10, an identification number, being an identification of a flexographic printing original plate P to be subjected to laser writing by the writing device 10, is associated with affixing information of an affixing to be applied to the relevant flexographic printing plate P2 in the affixing device 300 (step S20). This association is performed by the second information associating unit 340. The affixing information may include, for example, the affixing position of the flexographic printing plate P2 with respect to the sleeve S.

Figure 12:
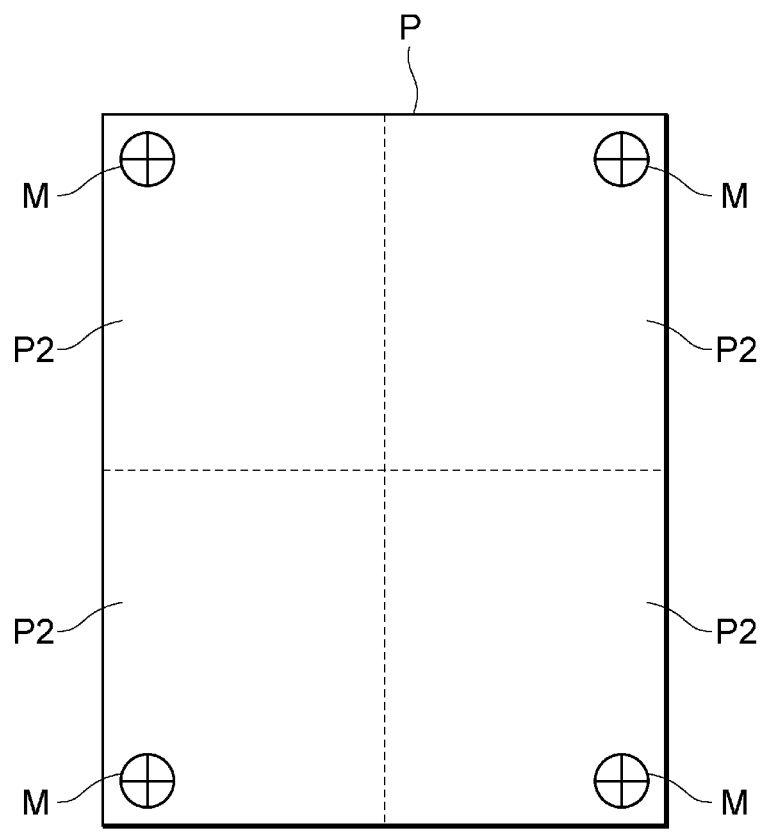
FIG. 12 is an illustration showing an example of a position detection mark.

In the laser writing process by the writing device 10 (S2), a position detection mark for detecting the position information of the flexographic printing plate P2 during the affixing step is also written, along with a desired image, onto the flexographic printing original plate P. As shown in FIG. 12, the position detection mark M may be a trim mark, and one or more, preferably two or more, position detection marks M may be provided.

After the identification number is sequentially sent from the writing device 10, to the exposure device 11, to the developing device 12 and to the plate cutting device 13, and the plate cutting is performed by the plate cutting device 13 (step S18), the identification number is transmitted to the affixing device 300 (step S21) and the affixing device 300 receives such identification number (step S22).

The affixing device 300 then stores the identification number in the device control unit 330. The affixing device 300 requests, from the writing device 10, affixing information corresponding to the received identification number (step S23). Upon receipt of a request signal for the affixing information (step S24), the writing device 10 sends the affixing information corresponding to the identification number to the affixing device 300 (step S25), and the affixing device 300 receives the affixing information (step S26). Such obtaining of the affixing information is performed by the second information obtaining unit 341.

In the affixing device 300, the position information of the flexographic printing plate P2 is also read by the camera 322 of the fourth transfer device 301 and stored in the device control unit 330. As a result, the position and angle of the flexographic printing plate P2 in the coordinate system are determined.

The affixing device 300 performs the affixing of the flexographic printing plate P2 based on the affixing information and the position information of the flexographic printing plate P2 that have been obtained (step S27). Specifically, the flexographic printing plate P2 is transferred to a predetermined position of the sleeve S by the fourth transfer device 301, where the flexographic printing plate P2 can be affixed onto the sleeve S by rotating the sleeve S. With such configuration, even if a plurality of flexographic printing original plates P are simultaneously processed in the writing device 10, the exposure device 11, the developing device 12 and the plate cutting device 13, each flexographic printing plate P2 can be affixed onto a desired position of a desired sleeve S without mistakes.

Regarding the management control in the above embodiment, other modes may be employed.

Other Mode 3

The writing device 10 may write an identification on the flexographic printing original plate P and the second information obtaining unit 341 may obtain the identification written on the flexographic printing original plate P, from which the flexographic printing plate P2 that will be subjected to affixing by the affixing device 300 derived from, for example, the camera 322 serving as a second reading unit, and obtain the affixing information that has been associated based on the identification by the second associating unit 340. The camera 322 functions not only as the reading device for the position information of the flexographic printing plate P2 but also as a reading device for the identification.

Figure 13:
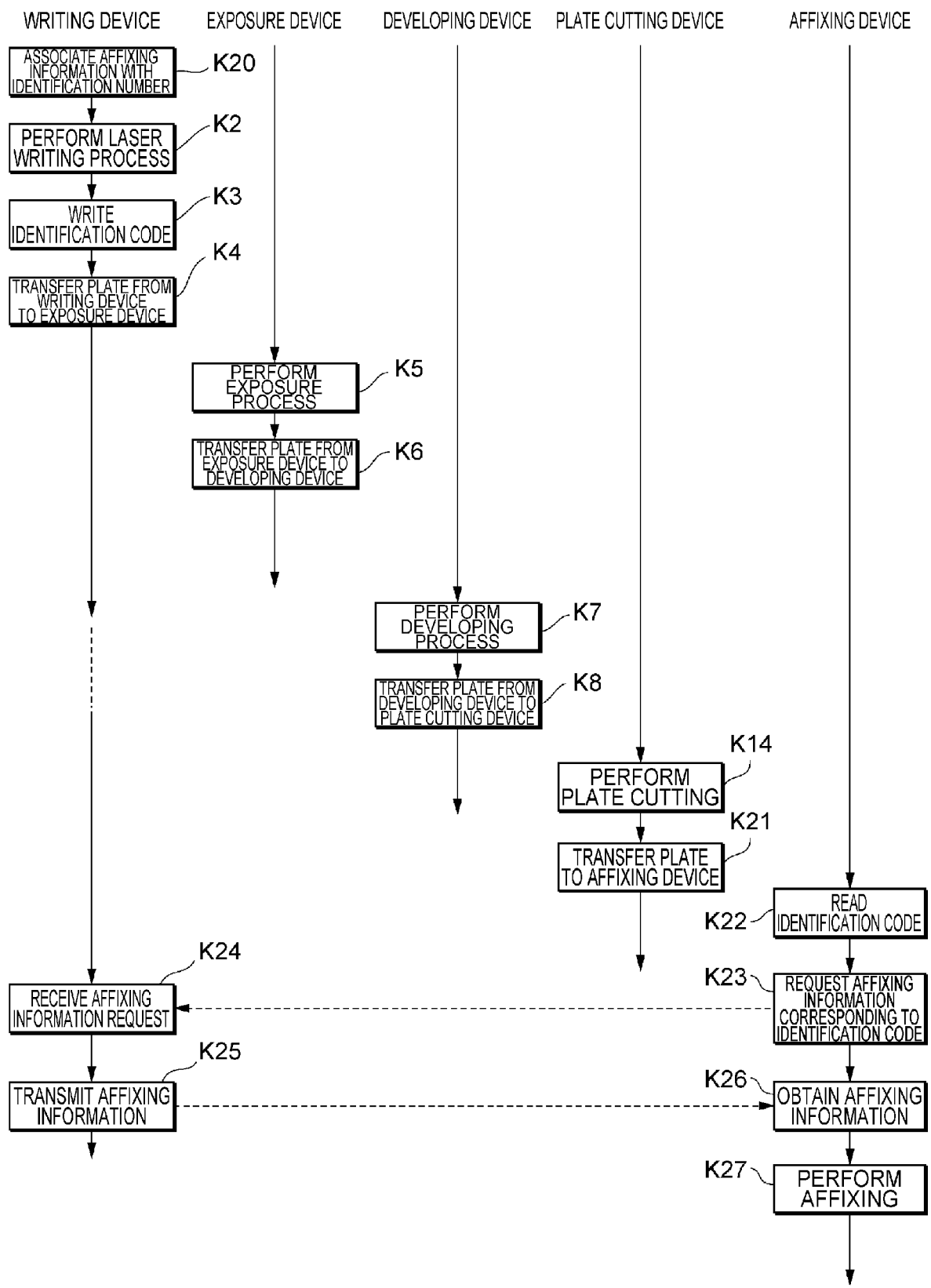
FIG. 13 is a flowchart showing a management control in another mode.

FIG. 13 shows an example flow of such management control. It should be noted that the steps for which no specific mention will be made are the same as the steps in the flow shown in FIG. 6 in the first embodiment, and the explanation of such steps will be omitted. First, in the writing device 10, an identification code, being the identification of the flexographic printing original plate P to be subjected to laser writing by the writing device 10, is associated with affixing information of an affixing to be applied to the relevant flexographic printing plate P2 in the affixing device 300 (step K20). This association is performed by the second information associating unit 340.

Next, in the writing device 10, a laser writing process is performed for the flexographic printing original plate P (step K2), and the identification code is laser-written on the flexographic printing original plate P (step K3). For example, a barcode or a QR code may be used as the identification code. At this time, an identification code may be assigned per a plurality of flexographic printing plates P2 which will later be produced by plate cutting. In the laser writing process by the writing device 10 (K2), a position detection mark for detecting the position information of the flexographic printing original plate P during the affixing step is also written, along with a desired image, onto the flexographic printing original plate P.

The flexographic printing original plate P is then subjected to an exposure process by the exposure device 11 (step K5), a developing process by the developing device 12 (step K7) and a plate cutting process by the plate cutting device 13 (step K14), and the flexographic printing plate P2 that results from the plate cutting is then transferred to the affixing device 300 (step K21).

Next, in the affixing device 300, the identification code of the flexographic printing plate P2 is read by the camera 322 (step K22), and stored in, for example, the device control unit 330. The affixing device 300 requests, from the writing device 10, affixing information corresponding to the received identification code (step K23). Upon receipt of a request signal (step K24), the writing device 10 sends the affixing information corresponding to the identification code to the affixing device 300 (step K25), and the affixing device 300 receives the affixing information (step K26). The obtaining of such affixing information is performed by the second information obtaining unit 341. Further, in the affixing device 300, the position information of the flexographic printing plate P2 is also read by the camera 322 and stored in the device control unit 330 (position information obtaining step). As a result, the position and angle of the flexographic printing plate P2 in the coordinate system are determined.

The affixing device 300 performs the affixing of the flexographic printing plate P2 based on the affixing information and the position information of the flexographic printing plate P2 that have been obtained (step K27).

Other Mode 4

The identification of the flexographic printing original plate P may be handling order information for flexographic printing original plates P. In such case, the plate making system 1 includes a job counter that counts flexographic printing plates P2 to be subjected to affixing by the affixing device 300. The second information obtaining unit 341 can obtain, from the job counter, the handling order information for the flexographic printing original plate P to be subjected to affixing by the affixing device 300, and obtain the affixing information associated by the second information associating unit 342 based on the handling order information of such flexographic printing original plate P.

Figure 14:
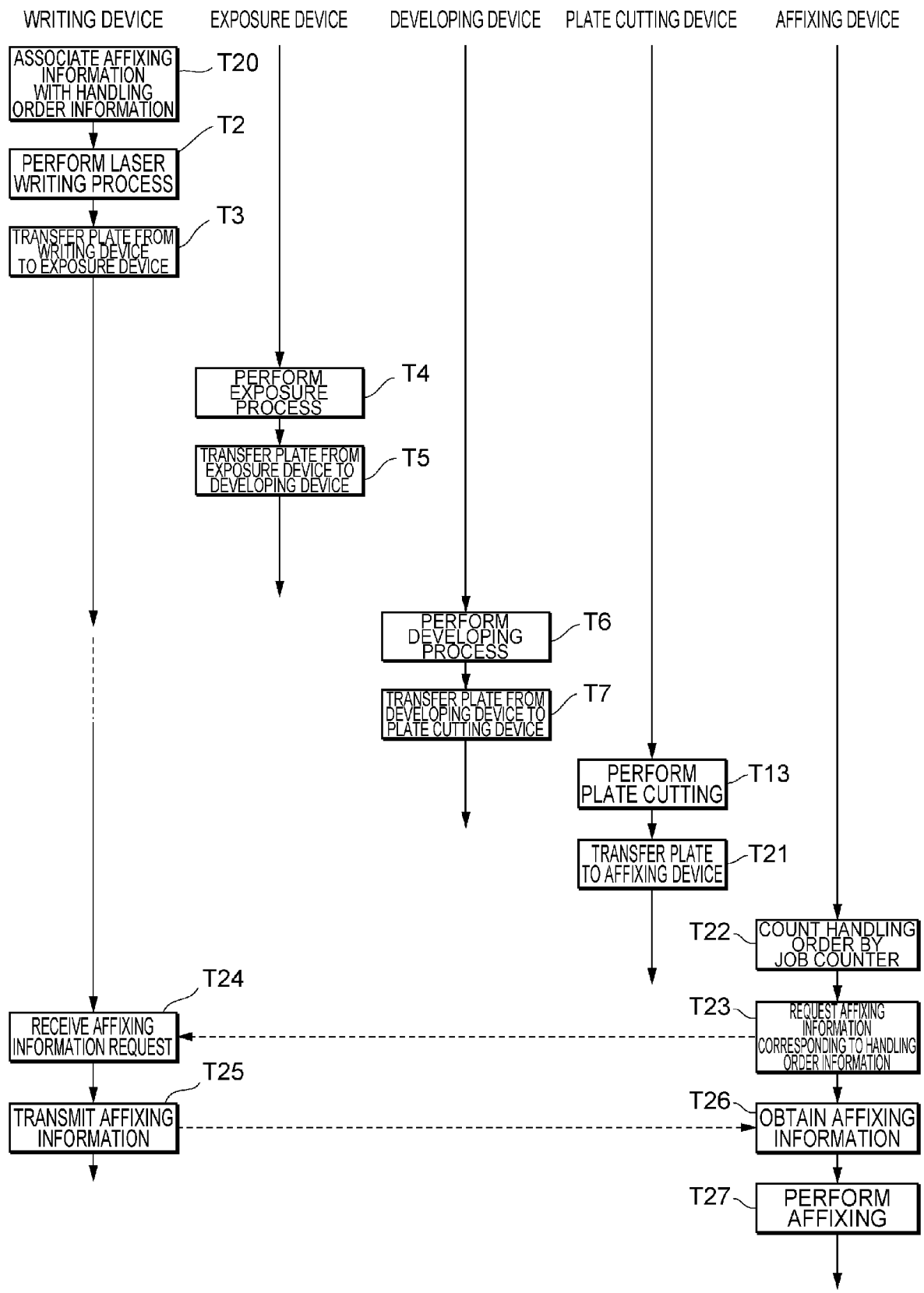
FIG. 14 is a flowchart showing a management control in a further mode.

FIG. 14 shows an example flow of such management control. It should be noted that the steps for which no specific mention will be made are the same as the steps in the flow shown in FIG. 8 in the first embodiment, and the explanation of such steps will be omitted. First, in the writing device 10, handling order information, being the identification of the flexographic printing original plate P to be subjected to laser writing by the writing device 10, is associated with affixing information about the affixing to be applied to the relevant flexographic printing original plate P in the affixing device 300 (step T20 in FIG. 8). Such association is performed by the second information associating unit 340. For example, the handling order information of the flexographic printing original plate P to be processed first is No. 1 and the handling order information of the flexographic printing original plate P to be processed next is No. 2. In the laser writing process by the writing device 10 (T2), a position detection mark for detecting the position information of the flexographic printing original plate P during the affixing step is also written, along with a desired image, onto the flexographic printing original plate P.

The flexographic printing original plate P is then subjected to an exposure process by the exposure device 11 (step T4), a developing process by the developing device 12 (step T6) and a plate cutting process by the plate cutting device 13 (step T13), and the flexographic printing plate P2 resulting from the plate cutting is then transferred to the affixing device 300 (step T21).

Next, in the affixing device 300, the flexographic printing plate 2 is counted by the job counter (step T22) and the handling order information is stored in, for example, the device control unit 330. The affixing device 300 requests, from the writing device 10, the affixing information corresponding to the handling order information of the counted flexographic printing original plate P (step T23). Upon receipt of the request signal (step T24), the writing device 10 sends the affixing information corresponding to the handling order information to the affixing device 300 (step T25) and the affixing device 300 receives such affixing information (step T26). Such obtaining of the affixing information is performed by the second information obtaining unit 341. Further, in the affixing device 300, the position information of the flexographic printing plate P2 is also read by the camera 322 and stored in the device control unit 330 (position information obtaining step). As a result, the position and angle of the flexographic printing plate P2 in the coordinate system are determined.

The affixing device 300 performs the affixing of the flexographic printing plate P2 based on the affixing information and the position information of the flexographic printing plate P2 that have been received (step T27).

The above-described management control of the present embodiment may be combined with the management control of the first embodiment.

Figure 15:
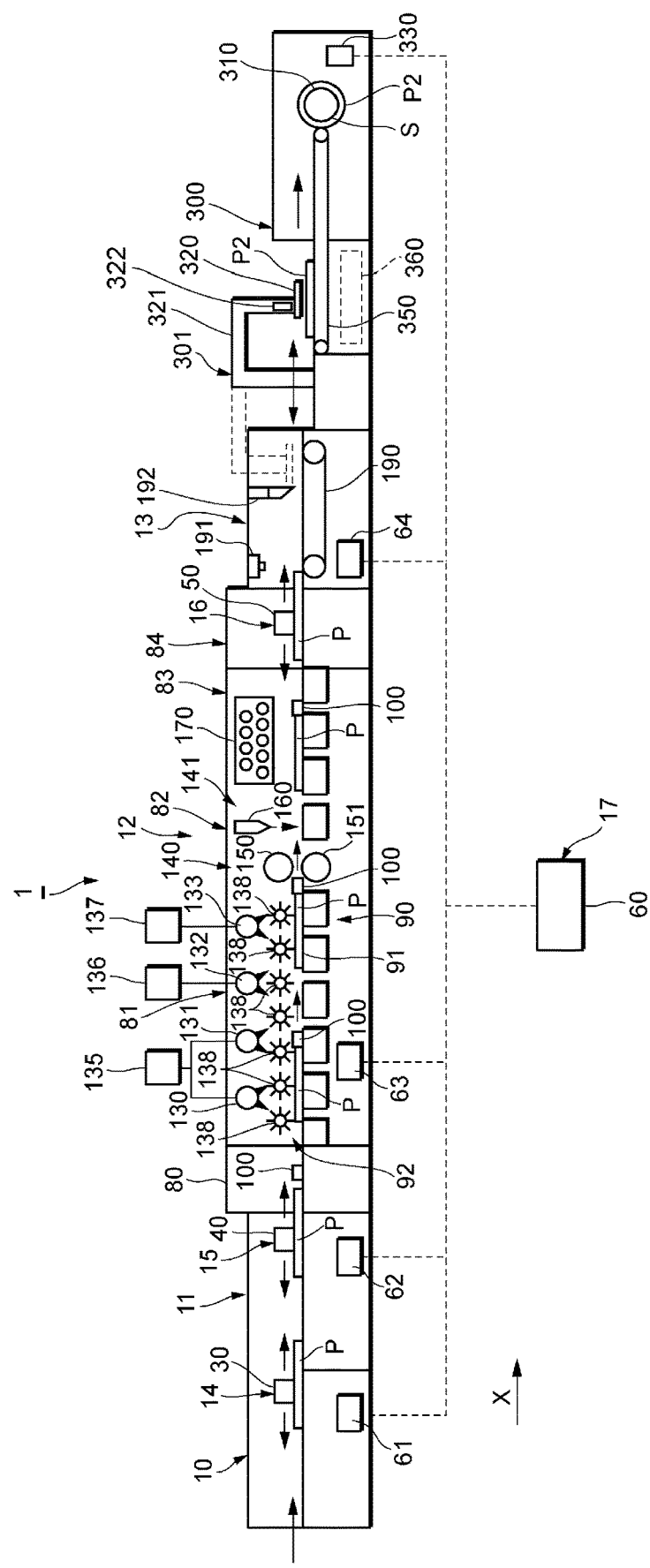
FIG. 15 is a schematic diagram showing a configuration of a plate making system in another mode according to the second embodiment.

In the present embodiment, as shown in FIG. 15, the affixing device 300 may include a mounter table 350 having a conveyor and may be configured such that the flexographic printing plate P2 that has been transferred to the mounter table 350 by the fourth transfer device 301 is conveyed using the mounter table 350, and the flexographic printing plate P2 that has been moved to an end of the mounter table 350 is affixed onto the sleeve S by moving the sleeve S up and down and rotating the sleeve S. Alternatively, the affixing device 300 may be configured such that the flexographic printing P2, after having been transferred by the mounter table 350, is transferred to a predetermined position of the sleeve S using another transfer device or the like and affixed onto the sleeve S. The position of the flexographic printing plate that is to be affixed onto the sleeve S is important in order to avoid causing any deviation in the rotation of the sleeve during printing. In addition, the affixing position of the flexographic printing plate in the sleeve lengthwise direction is important in order to slit a printed matter after printing, and the affixing start position of the flexographic printing plate is important with respect to the rotating direction of the sleeve. In the present system, the affixing position of the flexographic printing plate can be strictly controlled by transferring the flexographic printing plate to a desired position and rotating the sleeve S.

The affixing device 300 may have a stocker 360 that stores flexographic printing plates P2 before being subjected to affixing. In such case, the affixing device 300 may further include a transfer device for transferring the flexographic printing plate P2 into and out of the stocker 360. Such transfer device may be the fourth transfer device 301 or another transfer device provided separately from the fourth transfer device 301. In such case, the flexographic printing plate P2 resulting from the plate cutting by the plate cutting device 13 may be transferred, for example, to the stocker 360 of the affixing device 300. The affixing device 300 selects a flexographic printing plate P2 to be affixed onto the sleeve S from among the plates that have been subjected to plate cutting and the plates stored in the storage 360. Although the structure of the stocker 360 is not particularly limited, the stocker 360 may have, for example, a conveyor and/or a shelf. Further, the shelf may have a structure with a plurality of drawers or may have a structure of automatically moving up and down. With the configuration of providing the affixing device 300 with the stocker 360, it is possible to appropriately distribute and affix a plurality of flexographic printing plates P2 resulting from one flexographic printing plate P to a plurality of sleeves S in the affixing device 300 or appropriately combine flexographic printing plates P2 resulting from a plurality of flexographic printing original plates P and affix them onto a single sleeve S in the affixing device 300. With such storage step, it is possible to use the flexographic printing original plate P more efficiently and reduce the portion that will not be used for printing. In addition, the reading of the identification code in the affixing device 300 (K22) shown in FIG. 13 may be performed by the stocker 360 of the affixing device 300, and the counting of the handling order using the job counter (T22) shown in FIG. 14 may also be performed by the stocker 360. The stocker 360 may be provided inside the body of the affixing device 300 or arranged so as to be adjacent to the body of the affixing device 300 in a direction orthogonal to the transfer direction X.

Figure 16:
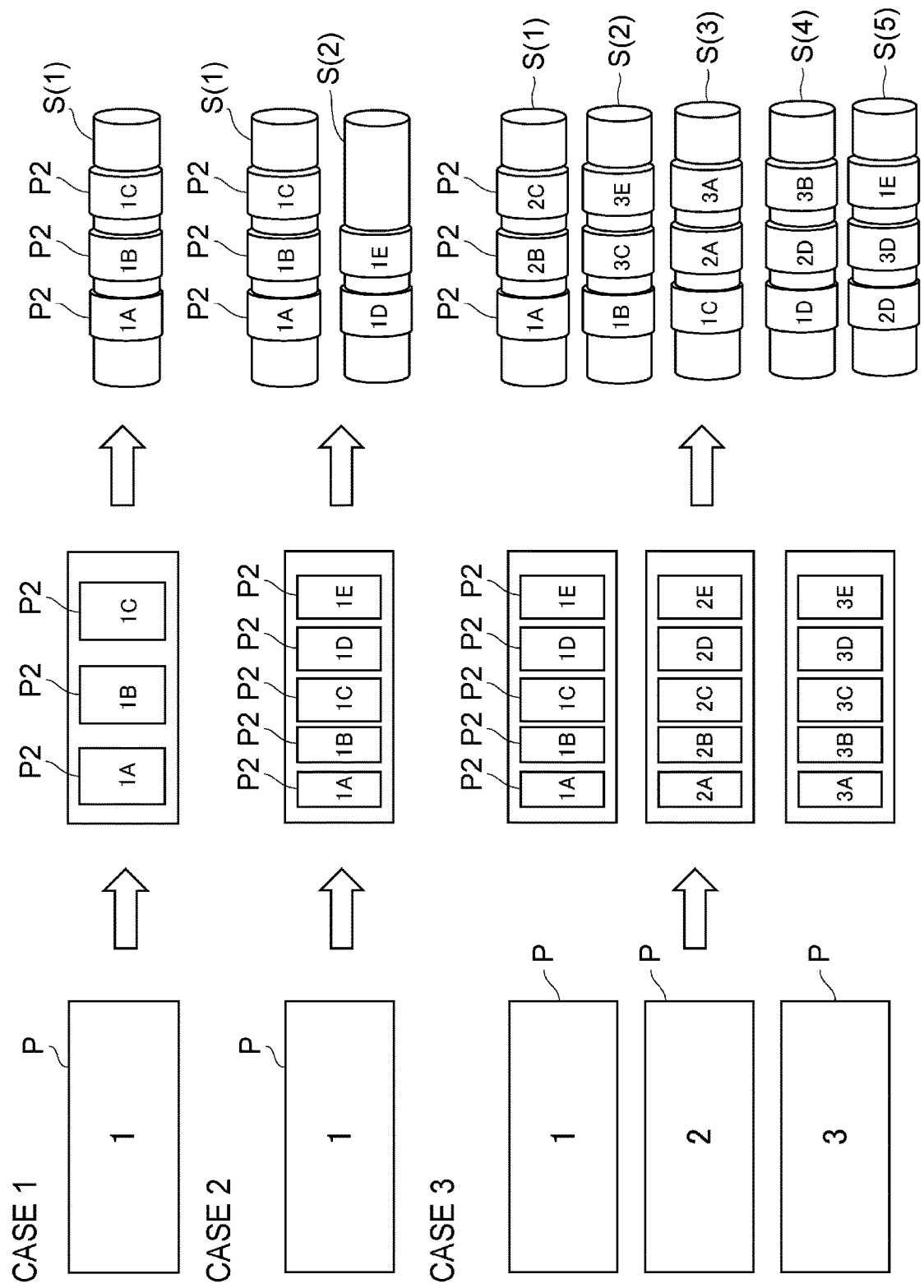
FIG. 16 is an illustration showing how multiple pieces of flexographic printing plates, which have been cut from a flexographic printing original plate, are affixed to a sleeve.

In the second embodiment, as shown in FIG. 16, in addition to the configuration of affixing a plurality of flexographic printing plates P2 resulting from the plate cutting of one flexographic printing plate P onto a single sleeve S (case 1), a plurality of flexographic printing plates P2 resulting from the plate cutting of one flexographic printing original plate P may be affixed to a plurality of sleeves S (case 2) or a plurality of flexographic printing plates P2 resulting from the plate cutting of a plurality of flexographic printing original plates P may be affixed onto a plurality of sleeves S (case 3).

For example, in case 1, one flexographic printing original plate P (1) is subjected to plate cutting and results in three flexographic printing plates P2 (1A, 1B, 1C), which are affixed onto one sleeve (1).

In case 2, one flexographic printing plate P (1) is subjected to plate cutting and results in five flexographic printing plates P2 (1A, 1B, 1C, 1D, 1E), in which the flexographic printing plates P2 (1A, 1B, 1C) are affixed onto a sleeve S(1) and the flexographic printing plates P2 (1D, 1E) are affixed onto a sleeve S(2).

In case 3, three flexographic printing original plates P (1, 2, 3) are subjected to plate cutting and each results in five flexographic printing plates P2 (1A, 1B, 1C, 1D, 1E), (2A, 2B, 2C, 2D, 2E) and (3A, 3B, 3C, 3D, 3E), each of which is affixed onto any one of five sleeves S (1, 2, 3, 4, 5).

In these cases, by using the above-described stocker 360, the order of the flexographic printing plates P2 to be affixed onto the sleeve S can be appropriately adjusted.

The affixing device 300 may manage the affixing of flexographic printing plates P2 onto the sleeve S on a per-plate cutting basis, based on an information tag affixed onto the flexographic printing plates P2 after the development, post-exposure and plate cutting. Such management may be performed by the device control unit 330 or the system control unit 60 or both. Although the affixing device 300 affixes the flexographic printing plate onto the sleeve S, it may alternatively affix the flexographic printing plate onto a printing cylinder.

Figure 17:
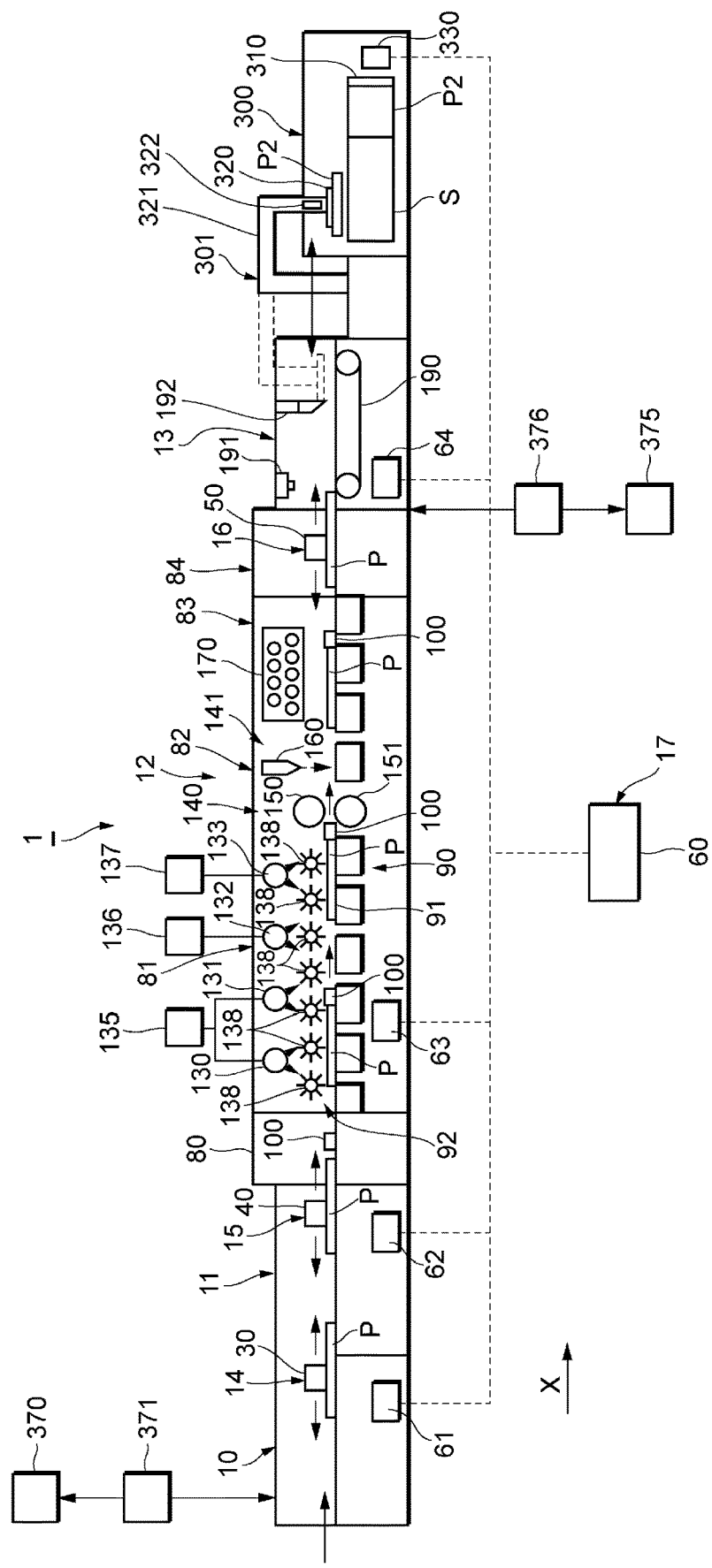
FIG. 17 is a schematic diagram showing a configuration of a plate making system having a stocker.

In the first and second embodiments described above, the plate making system 1 may include: a stocker 370 that stores flexographic printing original plates P before being subjected to writing by the writing device 10; and a plate supply device 371 that supplies the flexographic printing original plates from the stocker 370 to the writing device 10, as shown in FIG. 17. The stocker 370 may be arranged so as to be adjacent to the writing device 10 in the transfer direction X or arranged so as to be adjacent to the writing device 10 in a direction orthogonal to the transfer direction X. The plate supply device 371 may include a suction pad for transferring the flexographic printing original plates P and removing a protection sheet interposed between the flexographic printing original plates P, and may also include a roll or the like having a vacuum portion or an adhesive portion for peeling and removing a cover sheet (cover film) that has been provided for protecting the infrared sensitive layer of the flexographic printing original plate P.

In such plate making method, flexographic printing original plates P are stored in the stocker 370 in advance before being subjected to the writing step and are supplied from the stocker 370 to the writing device 10 by the plate supply device 371. At this time, the cover film on the flexographic printing original plate P is removed by the plate supply device 371. In this case, the storage of the flexographic printing original plates P before the writing and the supply and transfer thereof to the writing device 10 may be automatically performed.

The plate making system 1 may further include: a stocker 375 that stores flexographic printing original plates P between the developing step by the developing device 12 and the plate cutting step by the plate cutting device 13; and a transfer device 376 that transfers the flexographic printing original plates P between the stocker 375 and the developing device 12 or the plate cutting device 13. In such case, for example, the flexographic printing original plates P after the completion of the developing step may be temporarily stored in the stocker 375 and then transferred to the plate cutting device 13 at a necessary timing.

Figure 18:
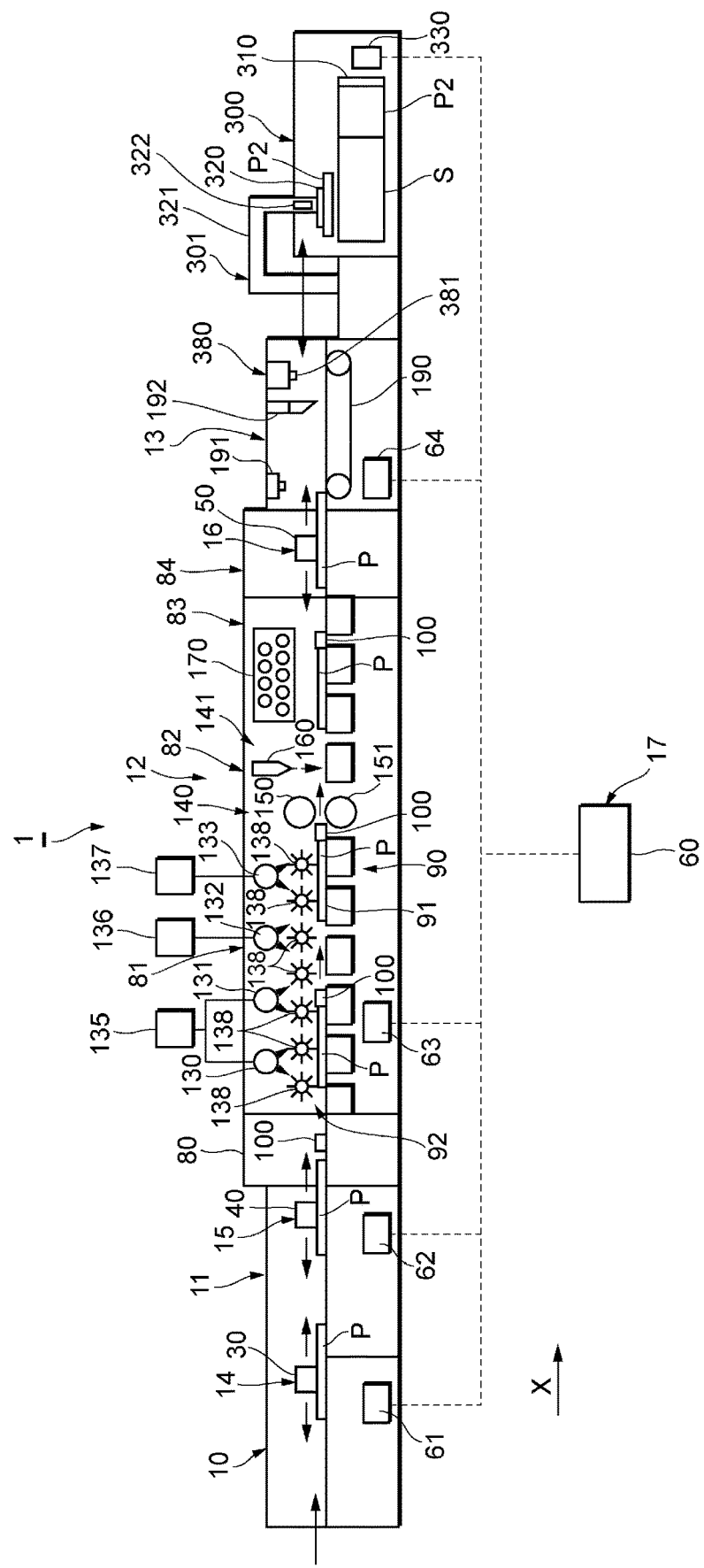
FIG. 18 is a schematic diagram showing an example of a configuration of a plate making system having a test device.

In the first and second embodiments described above, the plate cutting device 13 may include a test device 380 for testing the flexographic printing original plate P and/or the flexographic printing plate P2, as shown in FIG. 18. For example, the test device 380 may test the flexographic printing plate P2 after the plate cutting process based on the information written by the writing device 10. The test device 380 may, for example, compare the writing information written by the writing device 10 and the information of the flexographic printing plate P2 obtained from the camera 381 of the plate cutting device 13 and, based on the matching rate therebetween, test the appropriateness of the processes for the flexographic printing plate P2. The plate cutting device 13 may further include a transfer device for transferring the flexographic printing plate P2 in and out of the test device 380.

The test device 380 may test the flexographic printing original plate P after the developing process and before the plate cutting process. In addition, the test device 380 may be provided in the developing device 12. In such case, the developing device 12 may further include a transfer device for transferring the flexographic printing original plate P in and out of the test device 380. In such case, for example, a flexographic printing plate P2 unsuitable for printing due to, for example, the deposition of a foreign object, can be automatically detected, and an alert can be issued or such unsuitable flexographic printing plate P2 can be automatically removed.

Although preferred embodiments of the present invention have been described with reference to the attached drawings, the present invention is not limited to those examples. It is obvious that a person skilled in the art could conceive of various types of alterations and modifications within the scope of ideas defined in the scope of the claims, and such alterations and modifications should also be understood as belonging to the technical scope of the present invention, as a matter of course.

For example, in all of the above-described embodiments and modes, the writing device 10, the exposure device 11, the developing device 12, the plate cutting device 13, the first transfer device 14, the second transfer device 15, the third transfer device 16, the affixing device 300 and the fourth transfer device 301 of the plate making system 1 may have different configurations. Although the development performed by the developing device described in the above embodiments is a water development, an organic solvent development using an organic solvent as a solvent of a developer may be employed. In addition, the present invention may also be applied to the configuration in which heat development that does not use a developer (solvent) is employed as a development. In such case, the plate making system may be configured such that the developing device has a function of performing development and post-exposure without performing drying. Although the writing device 10, the exposure device 11, the developing device 12, the plate cutting device 13 and the affixing device 300 are arranged in a linear manner in the above-described embodiments, the writing device 10, the exposure device 11, the developing device 12 and the plate cutting device 13 (including the affixing device 300 in the configuration having the affixing device 300) may be arranged such that an angle is formed between some or all of the devices, in all of the above-described embodiments and modes. The angle between the devices may preferably be 135° or less, and more preferably 90° or less, in order to continuously transfer the plates. The angle of 135° or less is preferable, as it allows a workspace or a maintenance space to be secured. If the arrangement with an angle between the devices is employed, it is possible to rotate the flexographic printing original plate by using a transfer device having a suction pad, a rotary table, etc., and continuously perform the steps. Since the arrangement with an angle between the devices allows the length of the plate making system 1 in one direction to be shortened, such arrangement is effective when the length of a room for installing the plate making system 1 is desired to be short. For example, in the entire plate making system 1, devices in only one part may be arranged so as to form an angle therebetween, or devices in multiple parts (e.g., two parts) may be arranged so as to form an angle therebetween. Although the plate making processes of the plate making system are continuously performed without any gap between the steps in the above-described embodiments, for example, a certain time gap may be provided between the steps as long as the steps are performed sequentially.

In the present invention, various types of modifications may be made without departing from the gist of the invention. For example, part of the components in a certain embodiment or mode may be added to another embodiment or mode, within the scope of ordinary creativity of a person skilled in the art. In addition, part of of the components in a certain embodiment or mode may be substituted with a corresponding component in another embodiment or mode.

INDUSTRIAL APPLICABILITY

In the present invention, it is possible to automatically and continuously make flexographic printing original plates, shorten the time required for plate making, and stabilize the quality of the resulting flexographic printing original plates.

REFERENCE SIGNS LIST

1: Plate making system
10: Writing device
11: Exposure device
12: Developing device
13: Plate cutting device
14: First transfer device
15: Second transfer device
16: Third transfer device
17: Control device
P: Flexographic printing original plate

What is claimed is:
1. A plate making system, comprising:
a writing device that applies laser writing onto a flexographic printing original plate;
an exposure device that exposes the flexographic printing original plate subjected to the laser writing;
a developing device that develops the exposed flexographic printing original plate;
a plate cutting device that cuts the developed flexographic printing original plate;
a first transfer device that transfers the flexographic printing original plate subjected to the laser writing by the writing device to the exposure apparatus;
a second transfer device that transfers the flexographic printing original plate exposed by the exposure device to the developing device;
a third transfer device that transfers the flexographic printing original plate developed by the developing device to the plate cutting device,
wherein the plate making system comprises the writing device, the exposure device, the developing device, the plate cutting device, the first transfer device, the second transfer device and the third transfer device in an integrated manner, and
wherein the plate making system further comprises a control device that controls a series of plate making processes for the flexographic printing original plate performed by the writing device, the exposure device, the developing device and the plate cutting device; and
wherein the developing device performs development, drying, and post-exposure as an integrated unit, the developing device continuously transfers the flexographic printing original plate with a transfer device that has a plate setter for transferring the flexographic printing original plate; a device for attaching the plate setter to the flexographic printing original plate is provided at an entrance of the integrated unit of the developing device; and a device for removing the plate setter from the flexographic printing original plate is provided at an exit of the integrated unit of the developing device.

2. The plate making system according to claim 1, wherein the control device includes: device control units provided for the writing device, the exposure device, the developing device and the plate cutting device, respectively, and configured to control the respective devices; and a system control unit configured to control the plurality of devices so as to control the entire plate making system.

3. The plate making system according to claim 1, wherein the writing device, the exposure device, the developing device and the plate cutting device are arranged in a linear manner or arranged so as to form an angle between devices.

4. The plate making system according to claim 1, wherein the control device is configured to manage the series of plate making processes so that a desired plate cutting by the plate cutting device is performed for the flexographic printing original plate subjected to the laser writing by the writing device.

5. The plate making system according to claim 4, wherein the control device includes:
an information associating unit that associates an identification of a flexographic printing original plate to be subjected to the laser writing by the writing device with plate cutting information, related to this flexographic printing original plate, for causing a desired plate cutting to be performed by the plate cutting device; and
an information obtaining unit that obtains the identification of the flexographic printing original plate to be subjected to plate cutting by the plate cutting device and obtains, based on the obtained identification, the plate cutting information that has been associated with the obtained identification by the information associating unit, wherein the plate cutting device is configured to cut the flexographic printing original plate based on the plate cutting information obtained by the information obtaining unit.

6. The plate making system according to claim 5, wherein the information obtaining unit obtains the identification which has been sequentially transmitted from the writing device to the exposure device, to the developing device and to the plate cutting device.

7. The plate making system according to claim 5, wherein the identification of the flexographic printing original plate is delivered directly between the writing device and the exposure device, between the exposure device and the developing device, and between the developing device and the plate cutting device, and/or delivered using a combined route through the entire plate making system comprising the plurality of devices and the control device.

8. The plate making system according to claim 5, wherein:

the writing device writes the identification onto the flexographic printing original plate; and the information obtaining unit obtains the identification written on the flexographic printing original plate to be subjected to the plate cutting by the plate cutting device, and obtains, based on the obtained identification, the plate cutting information that has been associated with the obtained identification by the information associating unit.

9. The plate making system according to claim 8, further comprising at least one type of reading device, selected from a camera and a barcode reader, which reads the identification written on the flexographic printing original plate, wherein the information obtaining unit obtains the identification by converting data which has been read using the reading device into binarized data.

10. The plate making system according to claim 5, wherein:

the identification is handling order information for plate making of flexographic printing original plates; and the information obtaining unit obtains handling order information of a flexographic printing original plate to be subjected to plate cutting by the plate cutting device and obtains, based on the handling order information of the flexographic printing original plate, the plate cutting information that has been associated with the obtained handling order information by the information associating unit.

11. The plate making system according to claim 10, further comprising a job counter that counts flexographic printing original plates to be subjected to plate cutting by the plate cutting device, wherein the information obtaining unit obtains the handling order information of the flexographic printing original plates using the job counter.

12. The plate making system according to claim 1, wherein the control device calculates a desired developing amount for flexographic printing original plates to be developed by the developing device based on information of the flexographic printing original plates to be subjected to the laser writing by the writing device and adjusts a developing capacity of the developer based on the developing amount.

13. The plate making system according to claim 1, wherein:

the control device controls an exposure lamp so that a temperature of the flexographic printing original plate becomes constant during the post exposure.

14. The plate making system according to claim 1, wherein the development performed by the devloping device is water development.

15. The plate making system according to claim 1, further comprising:

an affixing device that affixes a flexographic printing plate subjected to plate cutting onto a sleeve or a printing cylinder; and a fourth transfer device that transfers the flexographic printing plate subjected to the plate cutting by the plate cutting device to the affixing device, wherein the plate making system comprises the writing device, the exposure device, the developing device, the plate cutting device, the first transfer device, the second transfer device, the third transfer device, the fourth transfer device and the affixing device in an integrated manner, and wherein the control device controls a series of plate making processes for the flexographic printing original plate and the flexographic printing plate performed by the writing device, the exposure device, the developing device, the plate cutting device and the affixing device.

16. The plate making system according to claim 15, wherein the control device further includes: a device control unit provided for the affixing device so as to control the affixing device.

17. The plate making system according to claim 15, wherein the writing device, the exposure device, the developing device, the plate cutting device and the affixing device are arranged in a linear manner or arranged so as to form an angle between devices.

18. The plate making system according to claim 15, wherein the control device is configured to manage the series of plate making processes so that affixing by the affixing device is performed at a desired position on the sleeve or on the print cylinder for the flexographic printing original plate subjected to the laser writing by the writing device.

19. The plate making system according to claim 18, wherein the control device includes:

a second information associating unit that associates an identification of a flexographic printing original plate to be subjected to the laser writing by the writing device with affixing information, related to this flexographic printing original plate, for causing a desired affixing to be performed by the affixing device; and a second information obtaining unit that obtains an identification of a flexographic printing plate to be subjected to affixing by the affixing device and obtains, based on the obtained identification, the affixing information that has been associated with the obtained identification by the second information associating unit, wherein the affixing device is configured to affix the flexographic printing plate based on the affixing information obtained by the second information obtaining unit.

20. The plate making system according to claim 19, wherein the second information obtaining unit obtains the identification which has been sequentially transmitted from the writing device, to the exposure device, to the developing device, to the plate cutting device and to the affixing device.

21. The plate making system according to claim 19, wherein:
the writing device writes the identification onto the flexographic printing original plate; and
the second information obtaining unit obtains the identification written on the flexographic printing original plate related to a flexographic printing plate to be subjected to affixing by the affixing device, and obtains, based on the obtained identification, the affixing information that has been associated with the obtained identification by the second information associating unit.

22. The plate making system according to claim 21, wherein an identification of the flexographic printing plate to be subjected to affixing is laser-written on at least two portions in the flexographic printing original plate by the writing device.

23. The plate making system according to claim 21, wherein:
the affixing device or the fourth transfer device includes at least one type of second reading device, selected from a camera and a barcode reader, which reads the identification written on the flexographic printing original plate; and
the second information obtaining unit obtains the identification by converting data which has been read using the second reading device into binarized data.

24. The plate making system according to claim 23, wherein:
the second reading device also obtains position information of the flexographic printing plate subjected to plate cutting; and
the affixing device is configured to affix the flexographic printing plate based on the affixing information obtained by the second information obtaining unit and the position information obtained by the second reading device.

25. The plate making system according to claim 19, wherein:
the identification is handling order information for plate making of flexographic printing original plates; and
the second information obtaining unit obtains handling order information of the flexographic printing plate to be subjected to affixing by the affixing device and obtains, based on the handling order information of the flexographic printing original plate, the affixing information that has been associated with the obtained handling order information by the second information associating unit.

26. The plate making system according to claim 15, wherein the fourth transfer device is a robotic arm having at least one type of suction pad selected from elastomer materials such as polybutadiene rubber, polyacrylonitrile butadiene rubber, polyurethane, silicone and fluorine-based rubber.

27. The plate making system according to claim 15, wherein the affixing device is configured to use the fourth transfer device to transfer the flexographic printing plate on the sleeve or the printing cylinder and directly affix the flexographic printing plate onto the sleeve or the printing cylinder while rotating the sleeve or the printing cylinder.

28. The plate making system according to claim 15, wherein the affixing device includes a mounter table having a conveyor, the affixing device being configured to convey, on the mounter table, the flexographic printing plate which has been transferred by the fourth transfer device onto the mounter table, and affix the flexographic printing plate onto the sleeve or the printing cylinder while rotating the sleeve or the printing cylinder having a cushioning tape affixed thereto.

29. The plate making system according to claim 15, wherein the affixing device includes a stocker that stores flexographic printing plates before being subjected to affixing.

30. The plate making system according to claim 1, further comprising: a stocker that stores flexographic printing original plates before being subjected to writing by the writing device; and a plate supply device that automatically supplies a flexographic printing original plate from the stocker to the writing device to remove a cover film from the flexographic printing original plate.

31. The plate making system according to claim 1, comprising a test device having a camera, the test device testing the flexographic printing original plate after development by the developing device and/or the flexographic printing plate after plate cutting by the plate cutting device.

32. The plate making system according to claim 31, wherein the test device tests the flexographic printing original plate and/or the flexographic printing plate based on information written by the writing device.

33. A plate making system, comprising:
a writing device that applies laser writing onto a flexographic printing original plate;
an exposure device that exposes the flexographic printing original plate subjected to the laser writing;
a developing device that develops the exposed flexographic printing original plate;
a plate cutting device that cuts the developed flexographic printing original plate;
a first transfer device that transfers the flexographic printing original plate subjected to the laser writing by the writing device to the exposure apparatus;
a second transfer device that transfers the flexographic printing original plate exposed by the exposure device to the developing device; and
a third transfer device that transfers the flexographic printing original plate developed by the developing device to the plate cutting device,
wherein the plate making system comprises the writing device, the exposure device, the developing device, the plate cutting device, the first transfer device, the second transfer device and the third transfer device in an integrated manner,
wherein the plate making system further comprises a control device that controls a series of plate making processes for the flexographic printing original plate performed by the writing device, the exposure device, the developing device and the plate cutting device, and
wherein the control device includes device control units provided for the writing device, the exposure device, the developing device and the plate cutting device, respectively, and configured to control the respective devices; and a system control unit configured to control the plurality of devices so as to control the entire plate making system, and
wherein the control device includes
an information associating unit that associates an identification of a flexographic printing original plate to be subjected to the laser writing by the writing device with plate cutting information, related to this flexographic printing original plate, for causing a desired plate cutting to be performed by the plate cutting device;
an information obtaining unit that obtains the identification of the flexographic printing original plate to be subjected to plate cutting by the plate cutting device and obtains, based on the obtained identification, the plate cutting information that has been associated with the obtained identification by the information associating unit, wherein the plate cutting device is configured to cut the flexographic printing original plate based on the plate cutting information obtained by the information obtaining unit; and wherein the developing device performs development, drying, and post-exposure as an integrated unit, the developing device continuously transfers the flexographic printing original plate with a transfer device that has a plate setter for transferring the flexographic printing original plate; a device for attaching the plate setter to the flexographic printing original plate is provided at an entrance of the integrated unit of the developing device; and a device for removing the plate setter from the flexographic printing original plate is provided at an exit of the integrated unit of the developing device.

34. The plate making system according to claim 33, wherein the information obtaining unit obtains the identification which has been sequentially transmitted from the writing device to the exposure device, to the developing device and to the plate cutting device.

* * * * *